(12) United States Patent
Kim et al.

(10) Patent No.: US 11,176,993 B2
(45) Date of Patent: Nov. 16, 2021

(54) SYNAPSE ELEMENT INCREASING A DYNAMIC RANGE OF AN OUTPUT WHILE SUPPRESSING AND/OR DECREASING POWER CONSUMPTION, AND A NEUROMORPHIC PROCESSOR INCLUDING THE SYNAPSE ELEMENT

(71) Applicant: Samsung Electronics Co., Ltd., Suwon-si (KR)

(72) Inventors: Jung-In Kim, Seoul (KR); Youngnam Hwang, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/876,563

(22) Filed: May 18, 2020

(65) Prior Publication Data

US 2021/0142847 A1   May 13, 2021

(30) Foreign Application Priority Data

Nov. 8, 2019   (KR) .................... 10-2019-0142605

(51) Int. Cl.
*G11C 11/56*   (2006.01)
*G11C 11/4096*   (2006.01)
(Continued)

(52) U.S. Cl.
CPC .......... *G11C 11/4096* (2013.01); *G06N 3/063* (2013.01); *G06N 3/0635* (2013.01);
(Continued)

(58) Field of Classification Search
CPC ... G11C 13/0023; G11C 13/003; G11C 11/22; G11C 11/54; G11C 11/4096;
(Continued)

(56) References Cited

U.S. PATENT DOCUMENTS 10,242,737 B1    3/2019  Lin et al.
2005/0190597 A1*  9/2005  Kato ................... G11C 11/22
                                            365/185.08
(Continued)

FOREIGN PATENT DOCUMENTS

KR    10-0814108 B1    3/2008
KR    10-2019-0046603 A    5/2019

*Primary Examiner* — Mushfique Siddique
(74) *Attorney, Agent, or Firm* — Harness, Dickey & Pierce, P.L.C.

(57) ABSTRACT

A neuromorphic processor may include at least a first synapse element. The first synapse element may include a first bit cell and a second bit cell, the first bit cell connected to a first bitline, a first inverted bitline, a first wordline, and a first inverted wordline, and the second bit cell connected to the first bitline, the first inverted bitline, a second wordline, and a second inverted wordline. The first synapse element may be configured to receive a first input through the first wordline, the first inverted wordline, the second wordline, and the second inverted wordline, store a first synapse value in the first bit cell and the second bit cell, perform a calculation operation using the first input and the first synapse value, and output a result of the calculation through the first bitline and the first inverted bitline.

20 Claims, 14 Drawing Sheets

(51) Int. Cl.
*G11C 11/4097* (2006.01)
*G11C 11/408* (2006.01)
*G11C 11/4074* (2006.01)
*G11C 11/4091* (2006.01)
*G11C 14/00* (2006.01)
*G11C 11/54* (2006.01)
*G06N 3/063* (2006.01)
*G11C 13/00* (2006.01)
*H01L 45/00* (2006.01)

(52) U.S. Cl.
CPC ...... *G11C 11/4074* (2013.01); *G11C 11/4085* (2013.01); *G11C 11/4091* (2013.01); *G11C 11/4097* (2013.01); *G11C 11/54* (2013.01); *G11C 13/004* (2013.01); *G11C 13/0069* (2013.01); *G11C 14/009* (2013.01); *G11C 11/5664* (2013.01); *H01L 45/122* (2013.01)

(58) Field of Classification Search
CPC . G11C 13/0069; G11C 13/004; G11C 14/009; G11C 11/4097; G11C 11/4085; G11C 11/4074; G11C 11/4091; G11C 11/5664; H01L 25/0657; H01L 45/122; G06N 3/063; G06N 3/0635; G06N 3/08
See application file for complete search history.

(56) References Cited

U.S. PATENT DOCUMENTS

| | | |
|---|---|---|
| 2018/0240009 A1 | 8/2018 | Lee |
| 2018/0287056 A1 | 10/2018 | Lee |
| 2018/0315473 A1 | 11/2018 | Yu et al. |
| 2019/0080755 A1* | 3/2019 | Seo ............... G11C 13/003 |
| 2019/0131977 A1* | 5/2019 | Obradovic ......... H03K 19/215 |
| 2019/0164044 A1 | 5/2019 | Song et al. |
| 2020/0167638 A1* | 5/2020 | Rummens ............. G06N 3/063 |
| 2020/0202206 A1* | 6/2020 | Rummens ............ G11C 13/004 |
| 2020/0279176 A1* | 9/2020 | Hatcher ............. G11C 11/1659 |
| 2021/0026601 A1* | 1/2021 | Kobayashi ........... G11C 7/1006 |
| 2021/0057011 A1* | 2/2021 | Hatcher .............. G06F 17/17 |

* cited by examiner

FIG. 6

| Input | WLa /WLa | WLb /WLb | Weight | VRM11, VRM21 | VRM12, VRM22 | BL | /BL | Output |
|---|---|---|---|---|---|---|---|---|
| +1 | VSS | VDD | +1 | LR | HR | Ion (VDD/HR) | 0 | +1 |
| +1 | VSS | VDD | −1 | HR | LR | 0 | Ion (VDD/HR) | −1 |
| −1 | VDD | VSS | +1 | LR | HR | 0 | Ion (VDD/HR) | −1 |
| −1 | VDD | VSS | −1 | HR | LR | VDD/HR | 0 | +1 |

FIG. 9

| | Bias | WLa | /WLa | WLb | /WLb | BL | /BL |
|---|---|---|---|---|---|---|---|
| Forward Bias | VRM11 (BC1) | VW | VW (On) | | | VSS | VW (Prohibition) |
| | VRM12 (BC1) | VW (On) | VW | | | VW (Prohibition) | VSS |
| | VRM21 (BC2) | | | VW | VW (On) | VW (Prohibition) | VSS |
| | VRM22 (BC2) | | | VW (On) | VW | VSS | VW (Prohibition) |
| Reverse Bias | VRM11 (BC1) | VSS | VW (On) | | | VW | VW (Prohibition) |
| | VRM12 (BC1) | VW (On) | VSS | | | VW (Prohibition) | VW |
| | VRM21 (BC2) | | | VSS | VW (On) | VW (Prohibition) | VW |
| | VRM22 (BC2) | | | VW (On) | VSS | VW | VW (Prohibition) |

SYNAPSE ELEMENT INCREASING A DYNAMIC RANGE OF AN OUTPUT WHILE SUPPRESSING AND/OR DECREASING POWER CONSUMPTION, AND A NEUROMORPHIC PROCESSOR INCLUDING THE SYNAPSE ELEMENT

CROSS-REFERENCE TO RELATED APPLICATIONS

This U.S. non-provisional application claims the benefit of priority under 35 U.S.C. § 119 to Korean Patent Application No. 10-2019-0142605, filed on Nov. 8, 2019, in the Korean Intellectual Property Office, the entire disclosure of which is incorporated by reference herein in its entirety.

BACKGROUND

Various example embodiments of the inventive concepts described herein relate to a semiconductor device, a system including a semiconductor device, and/or a method of operating a semiconductor device, and more particularly, relate to a semiconductor-based synapse element increasing a dynamic range of an output while suppressing and/or decreasing power consumption, and a neuromorphic processor including the synapse element.

As machine learning-related technologies and semiconductor-related technologies develop, there is an attempt to develop a neuromorphic processor performing a machine learning operation using a semiconductor device. The neuromorphic processor itself may store and update synapse data (or weight data), and may be configured to provide output data with respect to input data.

A neuromorphic processor that has been attempted until now is at a research and development stage and fails to reach a level applicable to actual applications. In particular, some proposed neuromorphic processors are problematic in that power consumption is excessive and/or a dynamic range of the output of the neuromorphic processor is very narrow. Accordingly, there is a continuous demand for a neuromorphic processor applicable to applications of an actual environment.

SUMMARY

Various example embodiments of the inventive concepts provide a synapse element capable of improving a dynamic range of an output while decreasing and/or suppressing power consumption and a neuromorphic processor including the synapse element.

According to at least one example embodiment, a neuromorphic processor includes at least a first synapse element. The first synapse element includes a first bit cell and a second bit cell, the first bit cell is connected to a first bitline, a first inverted bitline, a first wordline, and a first inverted wordline, and the second bit cell connected to the first bitline, the first inverted bitline, a second wordline, and a second inverted wordline, and the first synapse element is configured to, receive a first input through the first wordline, the first inverted wordline, the second wordline, and the second inverted wordline, store a first synapse value in the first bit cell and the second bit cell, perform a calculation operation using the first input and the first synapse value, and output a result of the calculation through the first bitline and the first inverted bitline.

According to at least one example embodiment, a neuromorphic processor includes a plurality of synapse elements each connected to a plurality of wordlines, a plurality of inverted wordlines, a plurality of bitlines, and a plurality of inverted bitlines, each of the plurality of synapse elements includes, a first bit cell connected to one bit line of the plurality of bitlines, one inverted bitline of the plurality of inverted bitlines, and one wordline of the plurality of wordlines, and a second bit cell connected to the one bitline, the one inverted bitline, and one inverted wordline corresponding to the one wordline of the plurality of wordlines, and each of the plurality of synapse elements are configured to, store a synapse value in the first bit cell and the second bit cell, receive an input through the one wordline and the one inverted wordline, perform a calculation operation based on the input and the synapse value, and output a result of the calculation operation through the one bitline and the one inverted bitline.

According to at least one example embodiment, a synapse element includes a first variable resistance memory element connected in series with a first transistor between a first input node and a first output node, a second variable resistance memory element connected in series with a second transistor between a second input node and a second output node, a third variable resistance memory element connected in series with a third transistor between a third input node and the second output node, and a fourth variable resistance memory element connected in series with a fourth transistor between a fourth input node and the first output node, wherein a gate of the first transistor is connected between the second variable resistance memory element and the second transistor, a gate of the second transistor is connected between the first variable resistance memory element and the first transistor, a gate of the third transistor is connected between the fourth variable resistance memory element and the fourth transistor, and a gate of the fourth transistor is connected between the third variable resistance memory element and the third transistor.

BRIEF DESCRIPTION OF THE FIGURES

The above and other objects and features of the example embodiments of the inventive concepts will become apparent by describing in detail example embodiments thereof with reference to the accompanying drawings.

FIG. 6 illustrates summarized operations of a synapse element of FIGS. 2 to 5 according to some example embodiments.

FIG. 9 illustrates examples of voltages applied to a synapse element to update a weight of the synapse element according to at least one example embodiment.

DETAILED DESCRIPTION

Below, various example embodiments of the inventive concepts may be described in detail and clearly to such an extent that one of ordinary skill in the art may implement the example embodiments of the inventive concepts.

Figure 1:
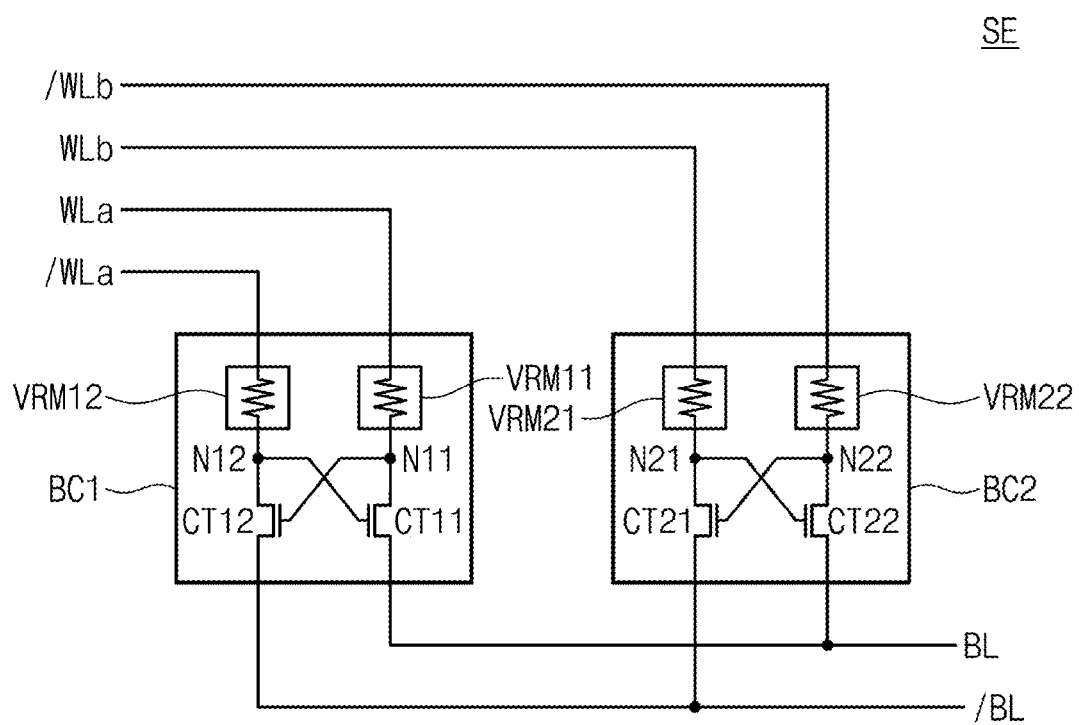
FIG. 1 is a circuit diagram illustrating a synapse element according to at least one example embodiment of the inventive concepts.

FIG. 1 is a circuit diagram illustrating a synapse element SE according to at least one example embodiment of the inventive concepts. Referring to FIG. 1, the synapse element SE may include a first bit cell BC1, and/or a second bit cell BC2, but is not limited thereto and may include a greater or lesser number of bit cells. For example, the first bit cell BC1 and the second bit cell BC2 may have the same structure, but may have a complementary connection relationship so as to operate in a complementary manner, but is not limited thereto.

The first bit cell BC1 may include a variable resistance memory cell VRM11, a variable resistance memory cell VRM12, a calculation transistor CT11, and/or a calculation transistor CT12, etc., but is not limited thereto. Below, an example connection relationship between components of the first bit cell BC1 is described, but the example embodiments are not limited thereto.

The variable resistance memory cell VRM11 may be connected between a wordline WLa and a node N11. The calculation transistor CT11 may be connected between a bitline BL and the node N11. A gate of the calculation transistor CT11 may be connected to a node N12.

The variable resistance memory cell VRM12 may be connected between an inverted wordline /WLa and the node N12. The calculation transistor CT12 is connected between the node N12 and an inverted bitline /BL. A gate of the calculation transistor CT12 may be connected to the node N11.

The second bit cell BC2 may include a variable resistance memory cell VRM21, a variable resistance memory cell VRM22, a calculation transistor CT21, and/or a calculation transistor CT22, but is not limited thereto. Below, an example connection relationship between components of the second bit cell BC2 is described, but the example embodiments are not limited thereto.

The variable resistance memory cell VRM21 may be connected between a wordline WLb and a node N21. The calculation transistor CT21 may be connected between the inverted bitline /BL and the node N21. A gate of the calculation transistor CT21 may be connected to a node N22.

The variable resistance memory cell VRM22 may be connected between an inverted wordline /WLb and the node N22. The calculation transistor CT22 is connected between the node N22 and the bitline BL. A gate of the calculation transistor CT22 may be connected to the node N21.

In at least one example embodiment, each of the plurality of variable resistance memory cells VRM11 and VRM21, and the variable resistance memory cells VRM12 and VRM22, of the first bit cell BC1 and the second bit cell BC2 may include a memory cell selected from various types of nonvolatile memory cells, such as a magnetic memory cell, a ferroelectric memory cell, a resistive memory cell, a phase-change memory cell, etc., but the example embodiments are not limited thereto.

The synapse element SE may store one weight (and/or synapse value). One weight (and/or synapse value) may be stored in the variable resistance memory cells VRM11 and VRM21 and the variable resistance memory cells VRM12 and VRM22 of the first bit cell BC1 and the second bit cell BC2, etc. For example, the weight (or synapse value) may be a value of "+1" or "−1".

For example, when a particular weight (and/or synapse value) is completely stored in the first and second bit cells BC1 and BC2, the variable resistance memory cells VRM11 and VRM21 may have the same resistance states (e.g., high-resistance states or low-resistance states). The variable resistance memory cells VRM12 and VRM22 may be identical and have resistance states (e.g., the low-resistance states or the high-resistance states) complementary to the resistance states of the variable resistance memory cells VRM11 and VRM21, but are not limited thereto.

For example, when a weight (and/or synapse value) of "+1" is stored in the synapse element SE, the variable resistance memory cells VRM11 and VRM21 may have the low-resistance states, and the variable resistance memory cells VRM12 and VRM22 may have the high-resistance states, but the example embodiments are not limited thereto. When a weight (or synapse value) of "−1" is stored in the synapse element SE, the variable resistance memory cells VRM11 and VRM21 may have the high-resistance states, and the variable resistance memory cells VRM12 and VRM22 may have the low-resistance states, but the example embodiments are not limited thereto. The above weights and resistance states according to the above weights may be determined depending on an operation rule of the synapse element SE.

In at least one example embodiment, the wordline WLa, the inverted wordline/WLa, the wordline WLb, and the inverted wordline /WLb of the synapse element SE may be implemented with inputs. For example, the synapse element SE may be configured to receive one input. For example, the synapse element SE may be an input of "+1" or "−1".

According to at least one example embodiment, when "+1" is input to the synapse element SE, a ground voltage VSS may be input to the wordline WLa and the inverted wordline /WLa, and a power supply voltage VDD may be input to the wordline WLb and the inverted wordline /WLb. Additionally, when "−1" is input to the synapse element SE, the power supply voltage VDD may be input to the wordline WLa and the inverted wordline /WLa, and the ground voltage VSS may be input to the wordline WLb and the inverted wordline /WLb. The above inputs and voltages according to the above inputs may be determined based on and/or depending on the operation rule of the synapse element SE, but the example embodiments are not limited thereto.

In at least one example embodiment, the bitline BL and the inverted bitline /BL of the synapse element SE may be used as outputs. According to some example embodiments, the synapse element SE may generate an output having an extended dynamic range to negative values as well as positive values by implementing the bitline BL and the inverted bitline /BL.

Figure 2:
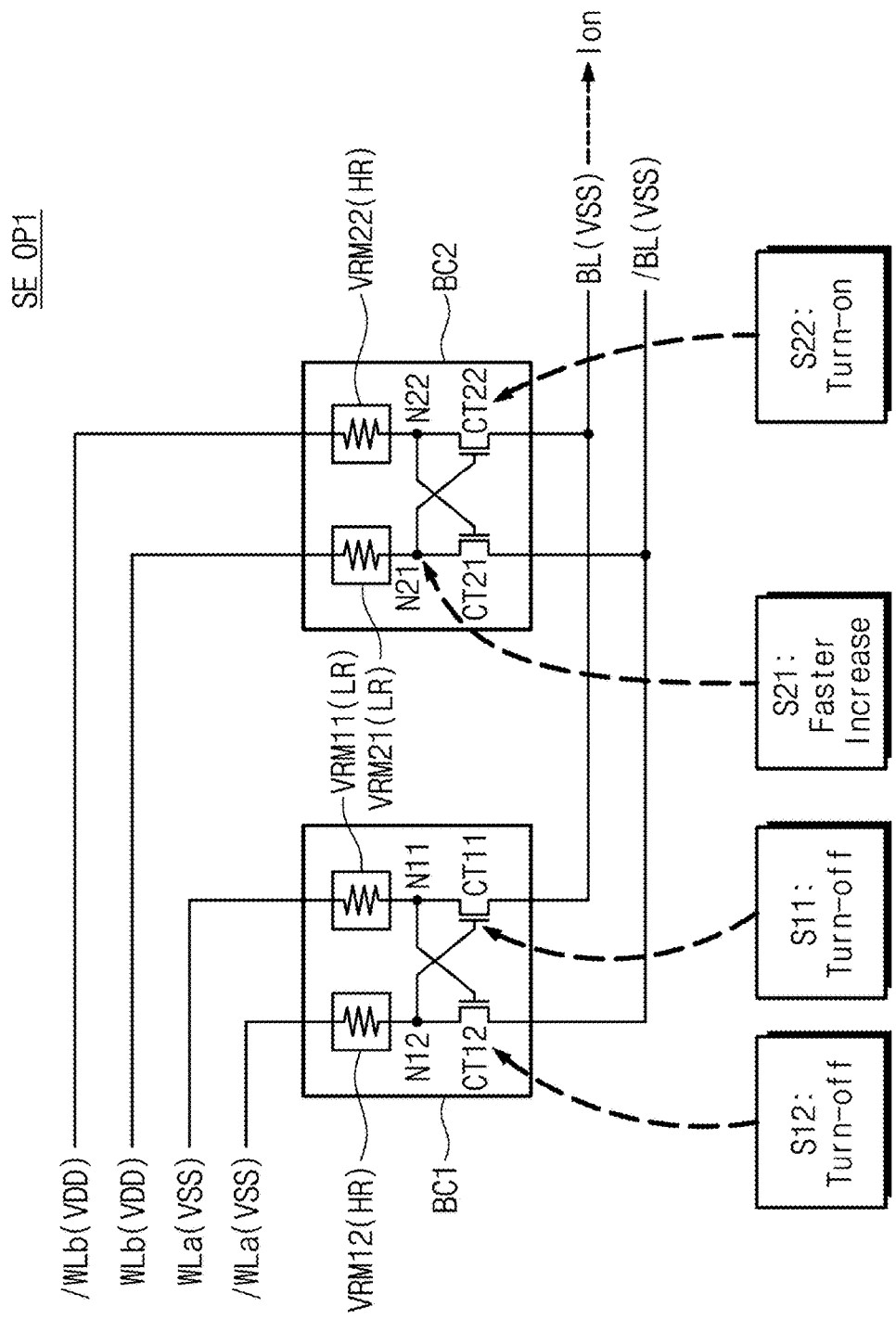
FIG. 2 illustrates an example in which a first operation of a synapse element is performed according to at least one example embodiment.

FIG. 2 illustrates an example in which a first operation SE_OP1 is performed at the synapse element SE according to at least one example embodiment. Referring to FIGS. 1 and 2, the variable resistance memory cells VRM11 and VRM21 may have low-resistance states LR, and the variable resistance memory cells VRM12 and VRM22 may have high-resistance states HR, but are not limited thereto. That is, the synapse element SE may store a weight (and/or synapse value) of "+1".

Before information is input to the synapse element SE, the power supply voltage VDD may be input to the wordline WLa and the inverted wordline /WLa, and voltages of the wordline WLb and the inverted wordline /WLb may be initialized to the ground voltage VSS, but are not limited thereto. Also, voltages of the bitline BL and the inverted bitline /BL may be biased (and/or initialized) to the ground voltage VSS, but are not limited thereto.

The ground voltage VSS may be input to the wordline WLa and the inverted wordline /WLa, and the power supply voltage VDD may be input to the wordline WLb and the inverted wordline /WLb. That is, information and/or data with a value of "+1" may be input to the synapse element SE.

Because the ground voltage VSS is input to the wordline WLa and the inverted wordline /WLa, voltages of the node N11 and the node N12 of the first bit cell BC1 may be the ground voltage VSS. Accordingly, in operation S11 and operation S12, the calculation transistor CT11 and the calculation transistor CT12 of the first bit cell BC1 are turned off. A current does not flow from the first bit cell BC1 to the bitline BL and the inverted bitline /BL.

Because the power supply voltage VDD is input to the wordline WLb and the inverted wordline /WLb, voltages of the node N21 and the node N22 of the second bit cell BC2 may start to increase (e.g., rise, etc.). Because the variable resistance memory cell VRM21 is at the low-resistance state LR, the variable resistance memory cell VRM21 has a load (e.g., resistance) smaller than the variable resistance memory cell VRM22 being at a high-resistance state HR. Accordingly, in operation S21, a voltage of the node N21 of the second bit cell BC2 increases more quickly than a voltage of the node N22 of the second bit cell BC2.

When the voltage of the node N21 of the second bit cell BC2 exceeds a desired threshold voltage of the calculation transistor CT22, in operation S22, the calculation transistor CT22 of the second bit cell BC2 is turned on. As the calculation transistor CT22 is turned on, an on-current Ion flows from the inverted wordline /WLb to the bitline BL through the variable resistance memory cell VRM22 and the calculation transistor CT22 of the second bit cell BC2.

The amperage amount of the on-current Ion may correspond to a value obtained by dividing the power supply voltage VDD by a resistance value of the variable resistance memory cell VRM22 being at the high-resistance state HR. Also, because the calculation transistor CT22 of the second bit cell BC2 is turned on, the ground voltage VSS biased to the bitline BL is transferred to the gate of the calculation transistor CT21 through the node N22. Accordingly, the calculation transistor CT21 of the second bit cell BC2 is not turned on.

Because the calculation transistor CT12 of the first bit cell BC1 is turned off, and the calculation transistor CT21 of the second bit cell BC2 is turned off, a current does not flow to the inverted bitline /BL from the first and second bit cells BC1 and BC2 according to this example.

That is, when information (e.g., data, values, etc.) of "+1" is input to the synapse element SE in a state where a weight (and/or synapse value) of "+1" is stored in the synapse element SE, the on-current Ion flows to the bitline BL, and a current does not flow to the inverted bitline /BL. The synapse element SE may output an output of "+1". That the above current flow of the bitline BL and the inverted bitline /BL is "+1" may be determined as a rule of the synapse element SE.

Figure 3:
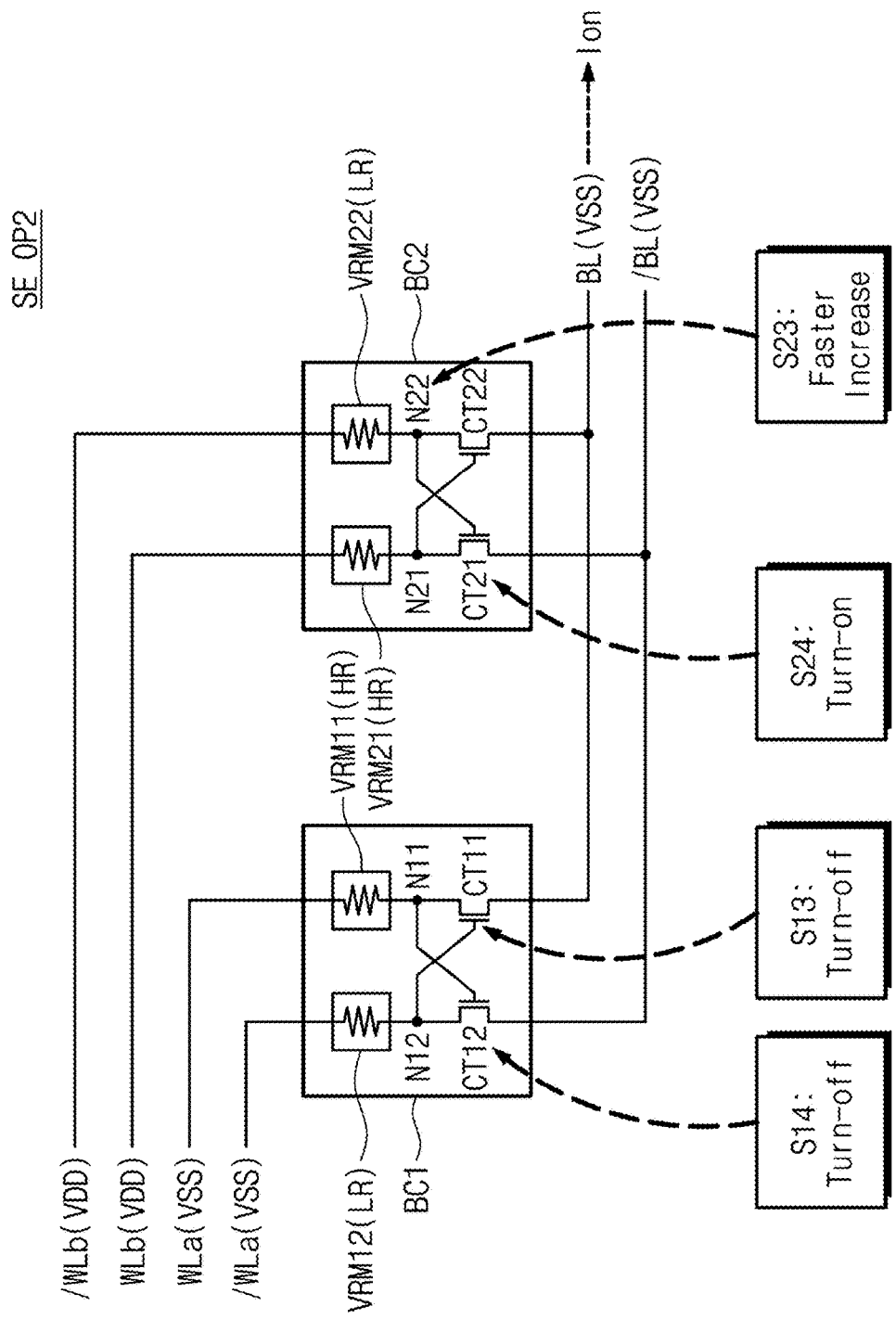
FIG. 3 illustrates an example in which a second operation of a synapse element is performed according to at least one example embodiment.

FIG. 3 illustrates an example in which a second operation SE_OP2 is performed at the synapse element SE according to at least one example embodiment. Referring to FIGS. 1 and 3, the variable resistance memory cells VRM11 and VRM21 may have the high-resistance states HR, and the variable resistance memory cells VRM12 and VRM22 may have the low-resistance states LR, but are not limited thereto. That is, the synapse element SE may store a weight (and/or synapse value) of "−1".

Before information (e.g., data, values, etc.) is input to the synapse element SE, the power supply voltage VDD may be input to the wordline WLa and the inverted wordline /WLa, and voltages of the wordline WLb and the inverted wordline /WLb may be initialized to the ground voltage VSS, but are not limited thereto. Also, voltages of the bitline BL and the inverted bitline /BL may be biased (and/or initialized) to the ground voltage VSS, but are not limited thereto.

The ground voltage VSS may be input to the wordline WLa and the inverted wordline /WLa, and the power supply voltage VDD may be input to the wordline WLb and the inverted wordline /WLb. That is, information (e.g., data, values, etc.) of "+1" may be input to the synapse element SE.

Because the ground voltage VSS is input to the wordline WLa and the inverted wordline /WLa, voltages of the node N11 and the node N12 of the first bit cell BC1 may be the ground voltage VSS. Accordingly, in operation S13 and operation S14, the calculation transistor CT11 and the calculation transistor CT12 of the first bit cell BC1 are turned off. A current does not flow from the first bit cell BC1 to the bitline BL and the inverted bitline /BL.

Because the power supply voltage VDD is input to the wordline WLb and the inverted wordline /WLb, voltages of the node N21 and the node N22 of the second bit cell BC2 may start to increase. Because the variable resistance memory cell VRM22 is at the low-resistance state LR, the variable resistance memory cell VRM22 has a load (e.g., resistance) smaller than the variable resistance memory cell VRM21 being at a high-resistance state HR. Accordingly, in operation S23, a voltage of the node N22 of the second bit cell BC2 increases more quickly than a voltage of the node N21 of the second bit cell BC2.

When the voltage of the node N22 of the second bit cell BC2 exceeds a desired threshold voltage of the calculation transistor CT21, in operation S24, the calculation transistor CT21 of the second bit cell BC2 is turned on. As the calculation transistor CT21 is turned on, the on-current Ion flows from the wordline WLb to the inverted bitline /BL through the variable resistance memory cell VRM21 and the calculation transistor CT21 of the second bit cell BC2.

The amount of the on-current Ion may correspond to a value obtained by dividing the power supply voltage VDD by a resistance value of the variable resistance memory cell VRM22 in the high-resistance state HR. Also, because the calculation transistor CT21 of the second bit cell BC2 is turned on, the ground voltage VSS biased to the bitline BL is transferred to the gate of the calculation transistor CT22 through the node N21. Accordingly, the calculation transistor CT22 of the second bit cell BC2 is not turned on.

Because the calculation transistor CT11 of the first bit cell BC1 is turned off and the calculation transistor CT22 of the second bit cell BC2 is turned off, a current does not flow to the bitline BL from the first and second bit cells BC1 and BC2.

That is, when information (e.g., data, values, etc.) of "+1" is input to the synapse element SE in a state where a weight (and/or synapse value) of "−1" is stored in the synapse element SE, the on-current Ion flows to the inverted bitline /BL, and current does not flow to the bitline BL. The output of the synapse element SE may be an output of "−1". That the above current flow of the bitline BL and the inverted bitline /BL is "−1" may be determined as a rule of the synapse element SE.

Figure 4:
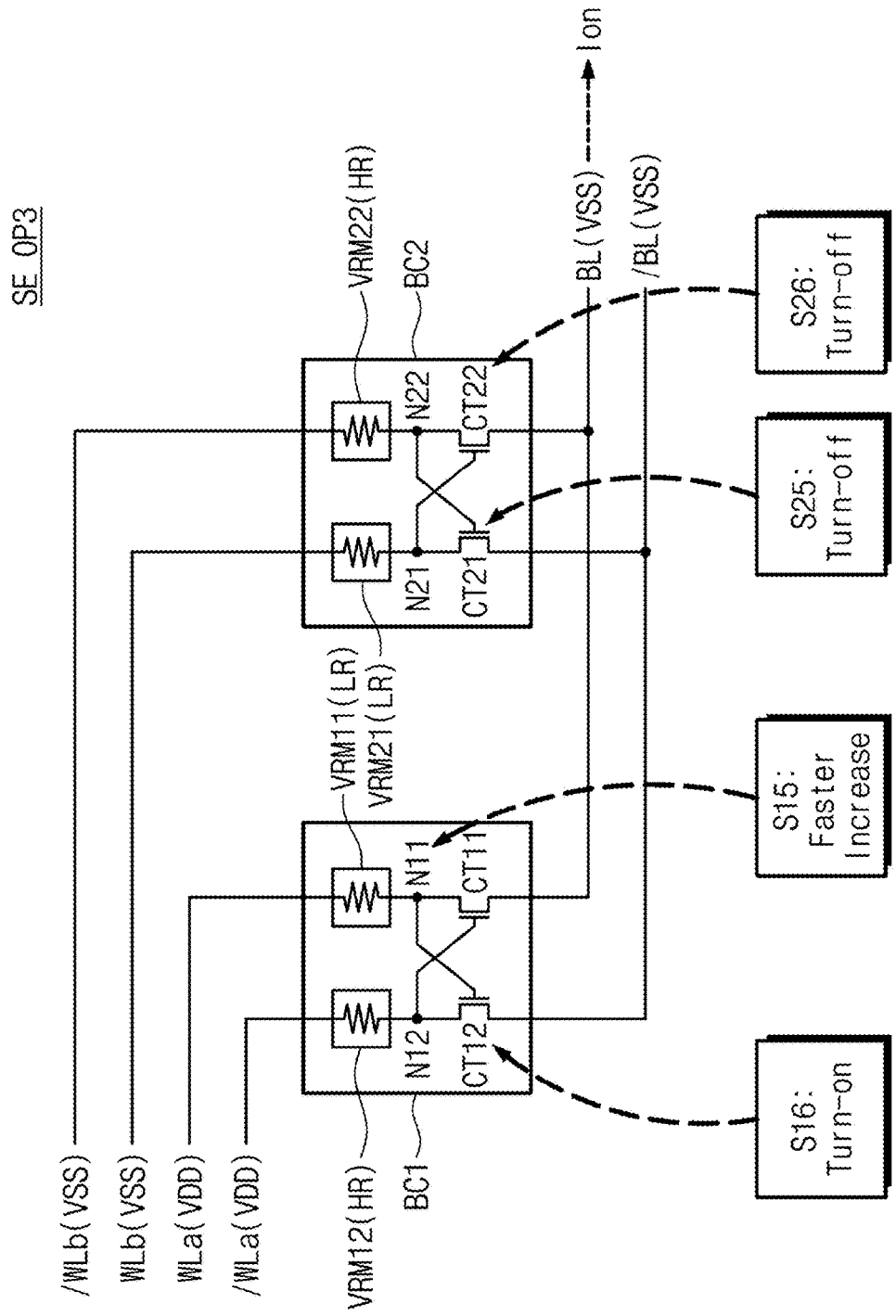
FIG. 4 illustrates an example in which a third operation of a synapse element is performed according to at least one example embodiment.

FIG. 4 illustrates an example in which a third operation SE_OP3 is performed at the synapse element SE according to at least one example embodiment. Referring to FIGS. 1 and 4, the variable resistance memory cells VRM11 and VRM21 may have low-resistance states LR, and the variable resistance memory cells VRM12 and VRM22 may have high-resistance states HR. That is, the synapse element SE may store a weight (and/or synapse value) of "+1".

Before information (e.g., data, etc.) is input to the synapse element SE, the power supply voltage VDD may be input to the wordline WLa and the inverted wordline /WLa, and voltages of the wordline WLb and the inverted wordline /WLb may be initialized to the ground voltage VSS, however the example embodiments are not limited thereto. Also, voltages of the bitline BL and the inverted bitline /BL may be biased (or initialized) to the ground voltage VSS, but are not limited thereto.

The power supply voltage VDD may be input to the wordline WLa and the inverted wordline /WLa, and the ground voltage VSS may be input to the wordline WLb and the inverted wordline /WLb. That is, information (e.g., data, values, etc.) of "−1" may be input to the synapse element SE.

Because the ground voltage VSS is input to the wordline WLb and the inverted wordline /WLb, voltages of the node N21 and the node N22 of the second bit cell BC2 may be the ground voltage VSS. Accordingly, in operation S25 and operation S26, the calculation transistor CT21 and the calculation transistor CT22 of the second bit cell BC2 are turned off. A current does not flow from the second bit cell BC2 to the bitline BL and the inverted bitline /BL.

Because the power supply voltage VDD is input to the wordline WLa and the inverted wordline /WLa, voltages of the node N11 and the node N12 of the first bit cell BC1 may start to increase (e.g., rise, etc.). Because the variable resistance memory cell VRM11 is at the low-resistance state LR, in operation S15, a voltage of the node N11 of the first bit cell BC1 increases more quickly than a voltage of the node N12 of the first bit cell BC1.

When the voltage of the node N11 of the first bit cell BC1 exceeds a desired threshold voltage of the calculation transistor CT12, in operation S16, the calculation transistor CT12 of the first bit cell BC1 is turned on. As the calculation transistor CT12 is turned on, the on-current Ion may flow to the inverted bitline /BL from the first bit cell BC1.

That is, when information (e.g., data, values, etc.) of "−1" is input to the synapse element SE in a state where a weight (and/or synapse value) of "+1" is stored in the synapse element SE, the on-current Ion flows to the inverted bitline /BL, and a current does not flow to the bitline BL. The output of the synapse element SE may be an output of "−1".

Figure 5:
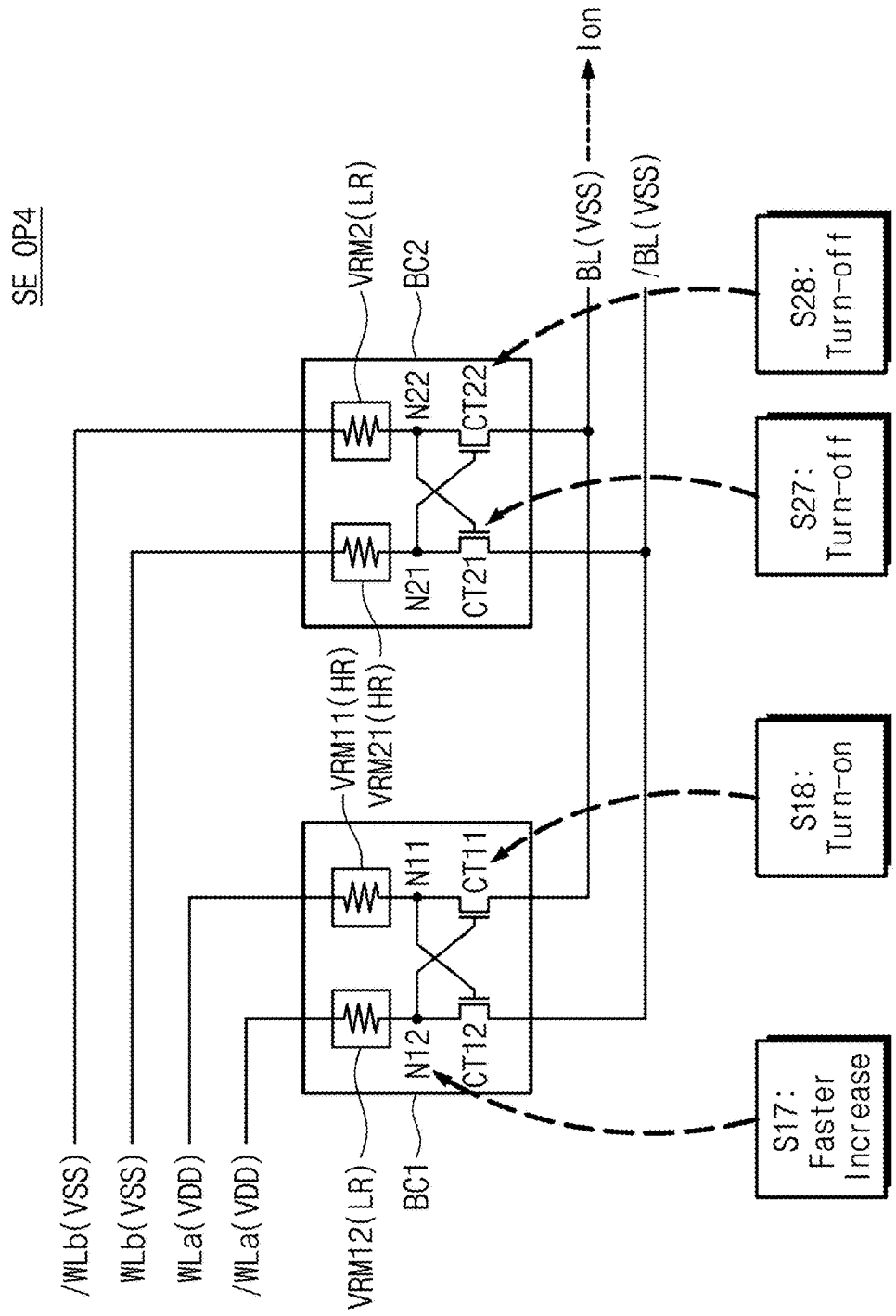
FIG. 5 illustrates an example in which a fourth operation of a synapse element is performed according to at least one example embodiment.

FIG. 5 illustrates an example in which a fourth operation SE_OP4 is performed at the synapse element SE according to at least one example embodiment. Referring to FIGS. 1 and 5, the variable resistance memory cells VRM11 and VRM21 may have the high-resistance states HR, and the and variable resistance memory cells VRM12 and VRM22 may have the low-resistance states LR. That is, the synapse element SE may store a weight (and/or synapse value) of "−1".

Before information is input to the synapse element SE, the power supply voltage VDD may be input to the wordline WLa and the inverted wordline /WLa, and voltages of the wordline WLb and the inverted wordline /WLb may be initialized to the ground voltage VSS. Also, voltages of the bitline BL and the inverted bitline /BL may be biased (and/or initialized) to the ground voltage VSS.

The power supply voltage VDD may be input to the wordline WLa and the inverted wordline /WLa, and the ground voltage VSS may be input to the wordline WLb and the inverted wordline /WLb. That is, information (e.g., data, values, etc.) of "−1" may be input to the synapse element SE.

Because the ground voltage VSS is input to the wordline WLb and the inverted wordline /WLb, voltages of the node N21 and the node N22 of the second bit cell BC2 may be the ground voltage VSS. Accordingly, in operation S27 and operation S28, the calculation transistor CT21 and the calculation transistor CT22 of the second bit cell BC2 are turned off. A current does not flow from the second bit cell BC2 to the bitline BL and the inverted bitline /BL.

Because the power supply voltage VDD is input to the wordline WLa and the inverted wordline /WLa, voltages of the node N11 and the node N12 of the first bit cell BC1 may start to increase (e.g., rise, etc.). Because the variable resistance memory cell VRM12 is at the low-resistance state LR, in operation S17, a voltage of the node N12 of the first bit cell BC1 increases more quickly than a voltage of the node N11 of the first bit cell BC1.

When the voltage of the node N12 of the first bit cell BC1 exceeds a desired threshold voltage of the calculation transistor CT11, in operation S18, the calculation transistor CT11 of the first bit cell BC1 is turned on. As the calculation transistor CT11 is turned on, the on-current Ion may flow to the bitline BL from the first bit cell BC1.

That is, when information (e.g., data, values, etc.) of "−1" is input to the synapse element SE in a state where a weight (and/or synapse value) of "−1" is stored in the synapse element SE, the on-current Ion flows to the bitline BL, and a current does not flow to the inverted bitline /BL. The output of the synapse element SE may be an output of "+1".

FIG. 6 illustrates summarized operations of the synapse element SE of FIGS. 2 to 4 according to some example embodiments. Referring to FIGS. 2, 3, and 6, when information (e.g., data, values, etc.) of "+1" is input to the synapse element SE, the ground voltage VSS is applied to the wordline WLa and the inverted wordline /WLa, and the power supply voltage VDD is applied to the wordline WLb and the inverted wordline /WLb.

Referring to FIGS. 4, 5, and 6, when information (e.g., data, values, etc.) of "−1" is input to the synapse element SE, the power supply voltage VDD is applied to the wordline WLa and the inverted wordline /WLa, and the ground voltage VSS is applied to the wordline WLb and the inverted wordline /WLb.

Referring to FIGS. 2, 4, and 6, when "+1" is stored in the synapse element SE as a weight (and/or synapse value), the variable resistance memory cells VRM11 and VRM21 may have the low-resistance states LR, and the variable resistance memory cells VRM12 and VRM22 may have the high-resistance states HR.

Referring to FIGS. 3, 5, and 6, when "−1" is stored in the synapse element SE as a weight (and/or synapse value), the variable resistance memory cells VRM11 and VRM21 may have the high-resistance states HR, and the variable resistance memory cells VRM12 and VRM22 may have the low-resistance states LR.

Referring to a first row of FIG. 6, when information (e.g., data, values, etc.) of "+1" is input through the wordlines WLa, /WLa, WLb, and /WLb in a state where the weight (and/or synapse value) of "+1" is stored in the synapse element SE, the on-current Ion flows through the bitline BL, and a current does not flow through the inverted bitline /BL. The output of the synapse element SE may be "+1". The amount of the on-current Ion may correspond to a value obtained by dividing the power supply voltage VDD by a resistance value of the high-resistance state HR.

Referring to a second row of FIG. 6, when information (e.g., data, values, etc.) of "+1" is input through the wordlines WLa, /WLa, WLb, and /WLb in a state where the weight (and/or synapse value) of "−1" is stored in the synapse element SE, the on-current Ion flows through the inverted bitline /BL, and a current does not flow through the bitline BL. The output of the synapse element SE may be "−1". The amount of the on-current Ion may correspond to a value obtained by dividing the power supply voltage VDD by a resistance value of the high-resistance state HR.

Referring to a third row of FIG. 6, when information (e.g., data, values, etc.) of "−1" is input through the wordlines WLa, /WLa, WLb, and /WLb in a state where the weight (and/or synapse value) of "+1" is stored in the synapse element SE, the on-current Ion flows through the inverted bitline /BL, and a current does not flow through the bitline BL. The output of the synapse element SE may be "−1". The amount of the on-current Ion may correspond to a value obtained by dividing the power supply voltage VDD by a resistance value of the high-resistance state HR.

Referring to a fourth row of FIG. 6, when information (e.g., data, values, etc.) of "−1" is input through the wordlines WLa, /WLa, WLb, and /WLb in a state where the weight (and/or synapse value) of "−1" is stored in the synapse element SE, the on-current Ion flows through the bitline BL, and a current does not flow through the inverted bitline /BL. The output of the synapse element SE may be "+1". The amount of the on-current Ion may correspond to a value obtained by dividing the power supply voltage VDD by a resistance value of the high-resistance state HR.

As illustrated in FIG. 6, the synapse element SE may perform an exclusive negative OR (XNOR) operation on the input information and the weight (and/or synapse value) and may provide a result of the operation as an output, but the example embodiments are not limited thereto, and the synapse element SE may be configured (e.g., hardwired, programmed, set, etc.) to perform other logical operations, such as negative AND (NAND) operations, etc.

That is, an output that the synapse element SE provides in the case where the input information and the weight (and/or synapse value) are identical may be different from an output that the synapse element SE provides in the case where the input information (e.g., data, values, etc.) and the weight (and/or synapse value) are different. Accordingly, compared with synapse elements that provide different outputs only in the case of corresponding to one of combinations of values of the input information (e.g., data, values, etc.) and the weight (and/or synapse value), the synapse element SE may perform more complicated calculation and meaningful calculation, of which an expression characteristic (e.g., speed, efficiency, power consumption, etc.) is improved.

Also, in the synapse element SE, a current flows through the bitline BL or through the inverted bitline /BL depending on the two cases, and currents of the bitlines BL and /BL may be generated to be complementary (or differential). Accordingly, a dynamic range of an output which is implemented with currents of the bitlines BL and /BL is extended to include negative values as well as positive values.

Also, the synapse element SE performs calculation only by using the power supply voltage VDD and the ground voltage VSS. Also, in all the two cases, the synapse element SE may allow the on-current Ion to flow through one of the bitlines BL and /BL not the both of them. Accordingly, unnecessary power consumption is decreased and/or prevented, or in other words, the circuit consumes less energy and/or is more energy efficient in comparison to conventional synapse elements and/or neuromorphic processors.

Figure 7:
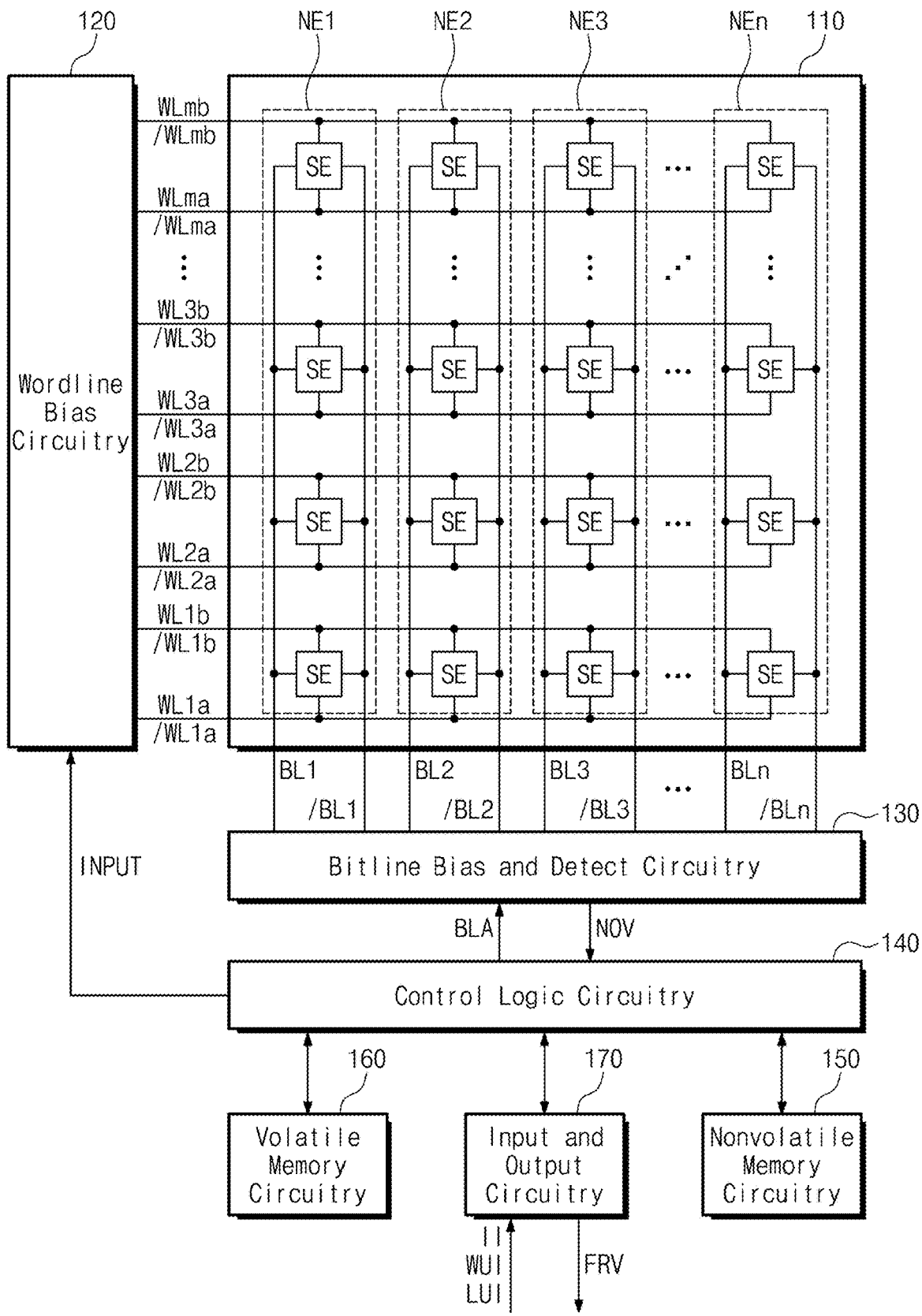
FIG. 7 is a block diagram illustrating a neuromorphic processor according to at least one example embodiment of the inventive concepts.

FIG. 7 is a block diagram illustrating a neuromorphic processor 100 according to at least one example embodiment of the inventive concepts. Referring to FIG. 7, the neuromorphic processor 100 may include a synapse element array 110, wordline bias circuitry 120, bitline bias and detect circuitry 130, control logic circuitry 140, a nonvolatile memory 150, a volatile memory 160, and/or input and output circuitry 170, etc., but is not limited thereto.

The synapse element array 110 may include a plurality of synapse elements SE. Each of the plurality of synapse elements SE may have the same structure as the synapse element SE of FIG. 1 and may operate depending on the manner described with reference to FIGS. 2 to 6, but are not limited thereto.

In at least one example embodiment, the synapse elements SE may be arranged in a plurality of rows and a plurality of columns. Synapse elements in each row may be connected with four wordlines, but is not limited thereto. For example, the synapse elements SE in the first row (e.g., in the order of being close to the bitline bias and detect circuitry 130) (hereinafter omitted) may be connected with a word line WL1a and an inverted word line /WL1a (illustrated using a single line to reduce the complexity of the figure, but may actually be composed of two or more lines, etc.) (hereinafter omitted) and may be connected with a word line WL1b and an inverted word line /WL1b (illustrated by a single line to reduce the complexity of the figure, but may actually be composed of two or more lines, etc.) (hereinafter omitted).

The synapse elements SE in the second row may be connected with a word line WL2a and an inverted word line /WL2a and may be connected with a word line WL2b and an inverted word line /WL2b. The synapse elements SE in the third row may be connected with a word line WL3a and an inverted word line /WL3a and may be connected with a word line WL3b and an inverted word line /WL3b. The synapse elements SE in the m-th row may be connected with an m-th word line WLma and an m-th inverted word line /WLma and may be connected with an m-th word line WLmb and an m-th inverted word line /WLmb. However, the example embodiments are not limited thereto, and other arrangements and/or configurations of the synapse elements may be utilized.

In at least one example embodiment, wordlines cited by using a reference sign "a" in FIG. 6 may correspond to wordlines cited by using a reference sign "a" in FIGS. 1 to 6. Wordlines cited by using a reference sign "b" in FIG. 6 may correspond to wordlines cited by using a reference sign "b" in FIGS. 1 to 6. Wordlines cited by using a reference sign "/" in FIG. 6 may correspond to wordlines cited by using a reference sign "/" in FIGS. 1 to 6. Bitlines cited by using a reference sign "/" in FIG. 6 may correspond to bitlines cited by using a reference sign "/" in FIGS. 1 to 6.

The synapse elements SE in each column may be connected with two bit lines. For example, the synapse elements SE in the first column (e.g., in the order of being close to the wordline bias circuitry 120) (hereinafter omitted) may be connected with a first bitline BL1 and a first inverted bitline /BL1.

The synapse elements SE in the second column may be connected with a second bitline BL2 and a second inverted bitline /BL2. The synapse elements SE in the third column may be connected with a third bitline BL3 and a third inverted bitline /BL3. The synapse elements SE in the n-th column may be connected with an n-th bitline BLn and an n-th inverted bitline /BLn.

The wordline bias circuitry 120 is connected with wordlines (e.g., WL1a to WLma), inverted wordlines (e.g., /WL1a to /WLma), wordlines (e.g., WL1b to WLmb), and inverted wordlines (e.g., /WL1b to /WLmb). As described with reference to FIGS. 1 to 6, each of the synapse elements SE receives input information (e.g., data, values, etc.) through the wordlines.

That is, the wordline bias circuitry 120 may provide input information (e.g., data, values, etc.) (or a plurality of input information) to the synapse elements SE. For example, the wordline bias circuitry 120 may receive an input INPUT from the control logic circuitry 140 and may provide input information (or a plurality of input information) to the synapse elements SE based on the input.

Also, in the case of storing weights (and/or synapse values) in the synapse elements SE, the wordline bias circuitry 120 may bias (and/or supply) voltages for performing a write operation on the variable resistance memory cells VRM1 and VRM2 (e.g., refer to FIG. 1, etc.) to the wordlines WL1a to WLma, the inverted wordlines /WL1a to /WLma, the wordlines WL1b to WLmb, and the inverted wordlines /WL1b to /WLmb.

The bitline bias and detect circuitry 130 is connected with the bitlines BL1 to BLn and the inverted bitlines /BL1 to /BLn, but is not limited thereto. As described with reference to FIGS. 1 to 6, the bitline bias and detect circuitry 130 may bias the ground voltage VSS to the bitlines BL1 to BLn and the inverted bitlines /BL1 to /BLn when performing a calculation operation on the respective synapse elements SE, but is not limited thereto.

As described with reference to FIGS. 1 to 6, each of the synapse elements SE provides an output through the plurality of bitlines. That is, the bitline bias and detect circuitry 130 may obtain results of calculations of the synapse elements SE by detecting the amounts (e.g., levels, etc.) of current flowing through the bitlines BL1 to BLn and the inverted bitlines /BL1 to /BLn.

Also, in the case of storing weights (and/or synapse values) in the synapse elements SE, the bitline bias and detect circuitry 130 may bias (and/or supply) voltages for performing a write operation on the variable resistance memory cells VRM1 and VRM2 (e.g., refer to FIG. 1, etc.) to the bitlines BL1 to BLn and the inverted bitlines /BL1 to /BLn.

In at least one example embodiment, calculation operations of the synapse elements SE may be performed in units of columns of the synapse elements SE, but are not limited thereto. For example, the bitline bias and detect circuitry 130 may receive a bitline address BLA from the control logic circuitry 140 and may select a column of synapse elements SE corresponding to the bitline address BLA.

One column for calculation may be selected from columns of synapse elements in the synapse element array 110. The wordline bias circuitry 120 may provide the same input information (e.g., "+1" or "−1") to the synapse elements SE in the selected column.

The synapse elements SE in the selected column may receive the same input information (e.g., data, values, etc.), may perform calculation on the input information and a weight (and/or synapse value) of each synapse element SE, and may output a result of the calculation through a plurality of connected bitlines. For example, each of synapse elements providing an output of "+1" from among the synapse elements SE in the selected column may output the on-current Ion to the corresponding bitline BL. On-currents that the synapse elements SE output may be added on the corresponding bitline BL. That is, the final amount (e.g., level, etc.) of current flowing to the bitline BL may correspond to the number of synapse elements providing an output of "+1" from among the synapse elements SE in the selected column, but the example embodiments are not limited thereto.

Likewise, for example, each of synapse elements providing an output of "−1" from among the synapse elements SE in the selected column may output the on-current Ion to the corresponding inverted bitline /BL. On-currents that the synapse elements SE output may be added on the corresponding inverted bitline /BL. That is, the final amount (e.g., level, etc.) of current flowing to the bitline BL may correspond to the number of synapse elements providing an output of "−1" from among the synapse elements SE in the selected column, but the example embodiments are not limited thereto.

The bitline bias and detect circuitry 130 may detect a current amount (e.g., level, etc.) of the corresponding bitline BL indicating an output a positive direction (e.g., "+1") and a current amount of the corresponding inverted bitline /BL indicating an output a negative direction (e.g., "−1"), and may obtain a final calculation result from a detection result.

A procedure of collecting outputs of the synapse elements SE in the selected column on the bitline BL and the inverted bitline /BL is similar to a mechanism in which one neuron receives and outputs information through synapse elements. Accordingly, each column of the synapse elements SE may be called a "neuron," etc. For example, first to n-th columns of the synapse elements SE may be called "first to n-th neuron elements NE1 to NEn".

As described above, in one neuron element, positive reactions and negative reactions of the synapse elements SE may be separately collected by a bitline bias and detect circuitry, but is not limited thereto. Accordingly, positive reactions and negative reactions of the synapse elements SE may be processed to be complementary (or differential), and a dynamic range of an output of a neuron element is extended to include negative values as well as positive values.

The bitline bias and detect circuitry 130 may convert outputs (e.g., current amounts of a positive direction and/or a negative direction) into a digital value, and may output the converted digital value as a neuron output value NOV, but the example embodiments are not limited thereto. The neuron output value NOV may be transferred to the control logic circuitry 140.

The nonvolatile memory 150 may store information (e.g., data) regarding and/or corresponding to connection relationships of the neuron elements NE1 to NEn of the synapse element array 110. For example, the nonvolatile memory 150 may store information about whether an initial input II is provided to any neuron element(s) of the neuron elements NE1 to NEn (and/or to which of the neuron element(s)) of the synapse element array 110.

The nonvolatile memory 150 may include information (e.g., data) regarding and/or corresponding to whether a neuron output value(s) of any neuron element(s) of the neuron elements NE1 to NEn in the synapse element array 110 is input to any other neuron element(s). The nonvolatile memory 150 may store information (e.g., data, etc.) regarding and/or corresponding to whether to select a neuron output value(s) of any neuron element(s) of the neuron elements NE1 to NEn in the synapse element array 110 as a final output value FRV.

That is, the nonvolatile memory 150 may include information (e.g., data, mapping, etc.) regarding and/or corresponding to the entire structure (and/or a subset) of a neural network implemented by the neuromorphic processor 100. The control logic circuitry 140 may read the information stored in the nonvolatile memory 150 and may control the wordline bias circuitry 120 and the bitline bias and detect circuitry 130 based on the read information.

For example, the control logic circuitry 140 may transfer the initial input II received through the input and output circuitry 170 to the wordline bias circuitry 120 as the input INPUT and/or may store the initial input II in the volatile memory 160, etc.

The control logic circuitry 140 may transfer the neuron output value NOV to the wordline bias circuitry 120 as the input INPUT, may temporarily store the neuron output value NOV in the volatile memory 160, and/or may transfer one of neuron output values stored in the volatile memory 160 to the wordline bias circuitry 120 as the input INPUT, but is not limited thereto.

Also, the control logic circuitry 140 may output the neuron output value NOV through the input and output circuitry 170 as the final result value FRV and/or may output one of the neuron output values stored in the volatile memory 160 to the outside through the input and output circuitry 170 as the final result value FRV, but is not limited thereto.

The control logic circuitry 140 may store weight update information WUI received through the input and output circuitry 170 in the volatile memory 160 and/or may update a weight (and/or synapse value) in variable resistance memory cells of at least some of the synapse elements SE by using the weight update information WUI stored in the volatile memory 160, but is not limited thereto.

For example, the control logic circuitry 140 may allow the wordline bias circuitry 120 to select and bias a particular row (or rows). For example, the control logic circuitry 140 may allow the bitline bias and detect circuitry 130 to select and bias a particular column (or columns). The control logic circuitry 140 may provide bias information for updating a weight (or synapse value) of a particular synapse element to the wordline bias circuitry 120 and the bitline bias and detect circuitry 130, respectively.

The control logic circuitry 140 may store link update information LUI received through the input and output circuitry 170 in the nonvolatile memory 150. The link update information LUI may include information about the entire structure (and/or a subset) of a neural network implemented by the neuromorphic processor 100.

According to at least one example embodiment, the control logic circuitry 140 may be processing circuitry and may include hardware including logic circuits; a hardware/software combination such as at least one processor executing software; or a combination thereof. The control logic circuitry 140 may control the overall operation of the neuromorphic processor 100. In at least one example embodiment, the control logic circuitry 140 may be implemented as, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. According to at least on example embodiment, the control logic circuitry 140 may control the functionality of at least one of the wordline bias circuitry 120, the bitline bias and detect circuitry 130, the nonvolatile memory 150, the volatile memory 160, and/or the input and output circuitry 170, etc. According to at least one other example embodiment, one or more of the wordline bias circuitry 120, the bitline bias and detect circuitry 130, the nonvolatile memory 150, the volatile memory 160, and/or the input and output circuitry 170, etc., may be included in the control logic circuitry 140. Additionally, one or more of the wordline bias circuitry 120, the bitline bias and detect circuitry 130, the nonvolatile memory 150, the volatile memory 160, and/or the input and output circuitry 170, may also include processing circuitry (not shown) to control the functionality of the respective circuitry.

The nonvolatile memory 150 may include an electrically erasable and programmable read only memory (EEPROM), a flash memory, a magnetic memory, a resistive memory, a ferroelectric memory, a phase change memory, an electrical fuse circuit, etc., but is not limited thereto. The volatile memory 160 may include a static random access memory, a dynamic random access memory, a register, a latch, a flip-flop, etc., but is not limited thereto.

At least one of the nonvolatile memory 150 and the volatile memory 160 may be included as a lower component of any other component (e.g., the control logic circuitry 140, etc.).

Figure 8:
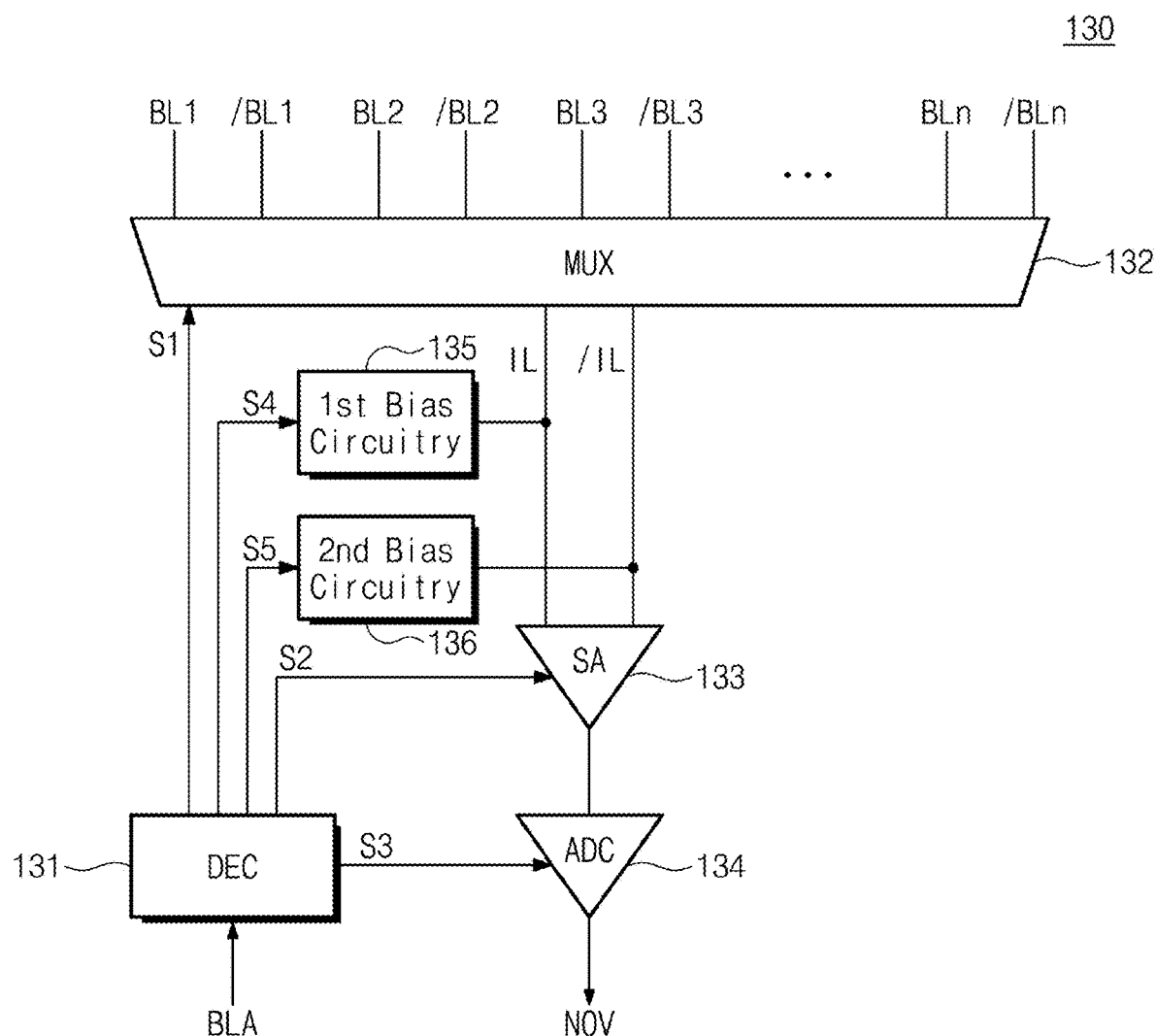
FIG. 8 is a block diagram illustrating an example of a bitline bias and detect circuitry according to at least one example embodiment of the inventive concepts.

FIG. 8 is a block diagram illustrating an example of the bitline bias and detect circuitry 130 according to at least one example embodiment of the inventive concepts. Referring to FIGS. 7 and 8, the bitline bias and detect circuitry 130 may include a decoder 131 (DEC), a multiplexer 132 (MUX), a sense amplifier 133, an analog-to-digital converter 134 (ADC), a first bias circuitry 135, and/or a second bias circuitry 136, etc., but is not limited thereto.

The decoder 131 may receive the bitline address BLA from the control logic circuitry 140. The decoder 131 may decode the bitline address BLA and may generate a first selection signal S1 based on (and/or depending on, etc.) a decoded result. The first selection signal S1 may control (and/or select, allow, etc.) the multiplexer 132 to connect one of the first to n-th bitlines BL1 to BLn to an intermediate line IL, and to connect one of the first to n-th inverted bitline /BL1 to /BLn to an inverted intermediate line /IL.

The decoder 131 may receive information (e.g., data, etc.) about whether the bitline address BLA is associated with calculation and/or is associated with updating a weight, together with the bitline address BLA. When the bitline address BLA is associated with calculation, the decoder 131 may activate the sense amplifier 133 and the analog-to-digital converter 134 through a second signal S2 and a third signal S3.

The multiplexer 132 may select one of a pair of the first bitline BL1 and the first inverted bitline /BL1 to a part of the bitline BLn and the inverted bitline /BLn in response to the first selection signal S1. The multiplexer 132 may connect the bitline BL and the inverted bitline /BL of the selected pair to the intermediate line IL and the inverted intermediate line /IL paired, respectively.

The sense amplifier 133 may sense a current amount (e.g., current level, etc.) of the intermediate line IL and a current amount (e.g., current level, etc.) of the inverted intermediate line /IL. For example, the sense amplifier 133 may output a voltage corresponding to a result of subtracting the current amount of the inverted intermediate line /IL from the current amount of the intermediate line IL (and/or a result of summing the current amounts) to the analog-to-digital converter 134, etc.

The analog-to-digital converter 134 may receive an output voltage of the sense amplifier 133 and may convert the received voltage into a digital value. The analog-to-digital converter 134 may output the converted digital value as the neuron output value NOV.

When the bitline address BLA is associated with updating a weight, the decoder 131 may activate the first bias circuitry 135 and the second bias circuitry 136 through a fourth signal S4 and a fifth signal S5. The first bias circuitry 135 and the second bias circuitry 136 may bias the intermediate line IL and the inverted intermediate line /IL, respectively. For example, the first bias circuitry 135 and the second bias circuitry 136 may respectively bias the intermediate line IL and the inverted intermediate line /IL under control of the control logic circuitry 140, but is not limited thereto.

FIG. 9 illustrates examples of voltages applied to the synapse element SE to update a weight (and/or synapse value) of the synapse element SE. Referring to FIGS. 1 and 9, a variable resistance memory cell VRM1 and/or VRM2 targeted for update may be forward biased when a voltage of a wordline side is higher than a voltage of a bitline side, but the example embodiments are not limited thereto. In contrast, the variable resistance memory cell VRM1 and/or VRM2 may be reverse biased when a voltage of a wordline side is lower than a voltage of a bitline side, but the example embodiments are not limited thereto.

A resistance state of each of the variable resistance memory cells, such as VRM1 and VRM2, etc., is changed by adjusting a direction of a current flowing through each of the variable resistance memory cells VRM1 and VRM2, etc., and/or a bias direction of a voltage. Accordingly, conditions of a forward bias and a reverse bias of the variable resistance memory cells VRM1 and VRM2 are illustrated in FIG. 9, and a method of updating a weight (and/or synapse value) of the synapse element SE is sufficiently described as examples, but the example embodiments are not limited thereto.

Referring to FIGS. 1 and 9, conditions for applying a forward bias to the variable resistance memory cell VRM11 of the first bit cell BC1 are described in a first row according to at least one example embodiment. For example, first, a write voltage VW (e.g., a positive voltage) may be applied to the inverted wordline /WLa, and the calculation transistor CT11 connected with the variable resistance memory cell VRM11 may be turned on.

For example, the write voltage VW may be applied to the wordline WLa, the ground voltage VSS may be applied to the bitline BL, and the variable resistance memory cell VRM11 of the first bit cell BC1 may be forward biased. The calculation transistor CT12 of the first bit cell BC1 may also be turned on by the write voltage VW of the wordline WLa. The write voltage VW may be applied to the first inverted bitline /BL1 for the purpose of impairing, decreasing and/or preventing the variable resistance memory cell VRM12 of the first bit cell BC1 from being biased.

Likewise, conditions for applying a forward bias to the variable resistance memory cell VRM12 of the first bit cell BC1 and the variable resistance memory cells VRM21 and VRM22 of the second bit cell BC2 are described in a second row, a third row, and a fourth row, etc. A voltage for turning on a calculation transistor connected with a variable resistance memory cell to be biased is marked by "On". A voltage for impairing, decreasing and/or preventing a bias of any other variable resistance memory cell in the same bit cell is marked by "Prohibition".

Conditions for applying a reverse bias to the variable resistance memory cell VRM11 of the first bit cell BC1 are described in a fifth row, but is not limited thereto. First, a write voltage VW (e.g., a positive voltage) may be applied to the inverted wordline /WLa, and the calculation transistor CT11 connected with the variable resistance memory cell VRM11 may be turned on.

For example, the write voltage VW may be applied to the bitline BL, the ground voltage VSS may be applied to the wordline WLa, and the variable resistance memory cell VRM11 of the first bit cell BC1 may be reverse biased. When the write voltage VW is applied to the bitline BL, the calculation transistor CT12 may be turned on. The write voltage VW may be applied to the inverted bitline /BL for the purpose of impairing, decreasing and/or preventing the variable resistance memory cell VRM12 of the first bit cell BC1 from being biased.

Likewise, conditions for applying a reverse bias to the variable resistance memory cell VRM12 of the first bit cell BC1 and the variable resistance memory cells VRM21 and VRM22 of the second bit cell BC2 are described in a sixth row, a seventh row, and an eighth row, however the example embodiments are not limited thereto. A voltage for turning on a calculation transistor connected with a variable resistance memory cell to be biased is marked by "On". A voltage for impairing, decreasing and/or preventing a bias of any other variable resistance memory cell in the same bit cell is marked by "Prohibition".

In at least one example embodiment, in FIG. 9, portions filled with dots may be considered as the ground voltage VSS or any voltage for increasing the stability, accuracy, and/or speed of update of a weight (and/or synapse value) of the synapse element SE is applied.

Referring to FIGS. 7 and 9, the neuromorphic processor 100 may update a weight (and/or synapse value) of each of the synapse elements SE by adjusting voltages of wordlines and bitlines based on FIG. 9, but is not limited thereto. The neuromorphic processor 100 may sequentially adjust resistance states of four variable resistance memory cells included in each synapse element SE, based on the conditions illustrated in FIG. 9, but is not limited thereto.

For example, the neuromorphic processor 100 may simultaneously adjust weights of two or more synapse elements SE. The neuromorphic processor 100 may respectively apply the ground voltage VSS and the write voltage VW to a particular bitline and a particular inverted bitline or may respectively apply the ground voltage VSS and the write voltage VW to the particular inverted bitline and the particular bitline, but is not limited thereto. The neuromorphic processor 100 may forward or reverse bias variable resistance memory cells at two or more synapse elements, by biasing voltages to word lines of the two or more synapse elements connected with a particular bitline and a particular inverted bitline as illustrated in FIG. 9.

Figure 10:
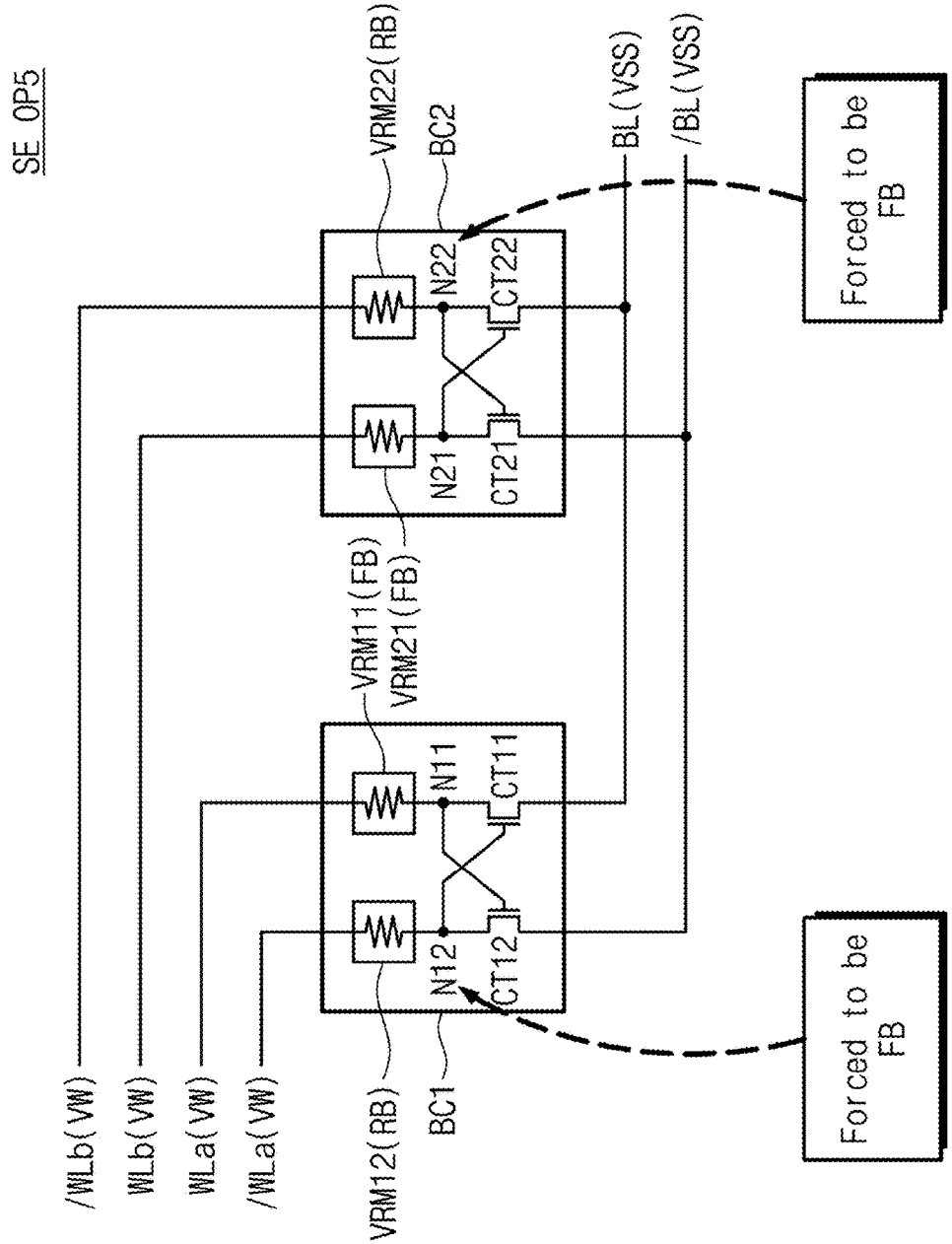
FIGS. 10 and 11 illustrate first examples of an operation of simultaneously updating resistance states of two variable resistance memory cells at a synapse element according to some example embodiments.
Figure 11:
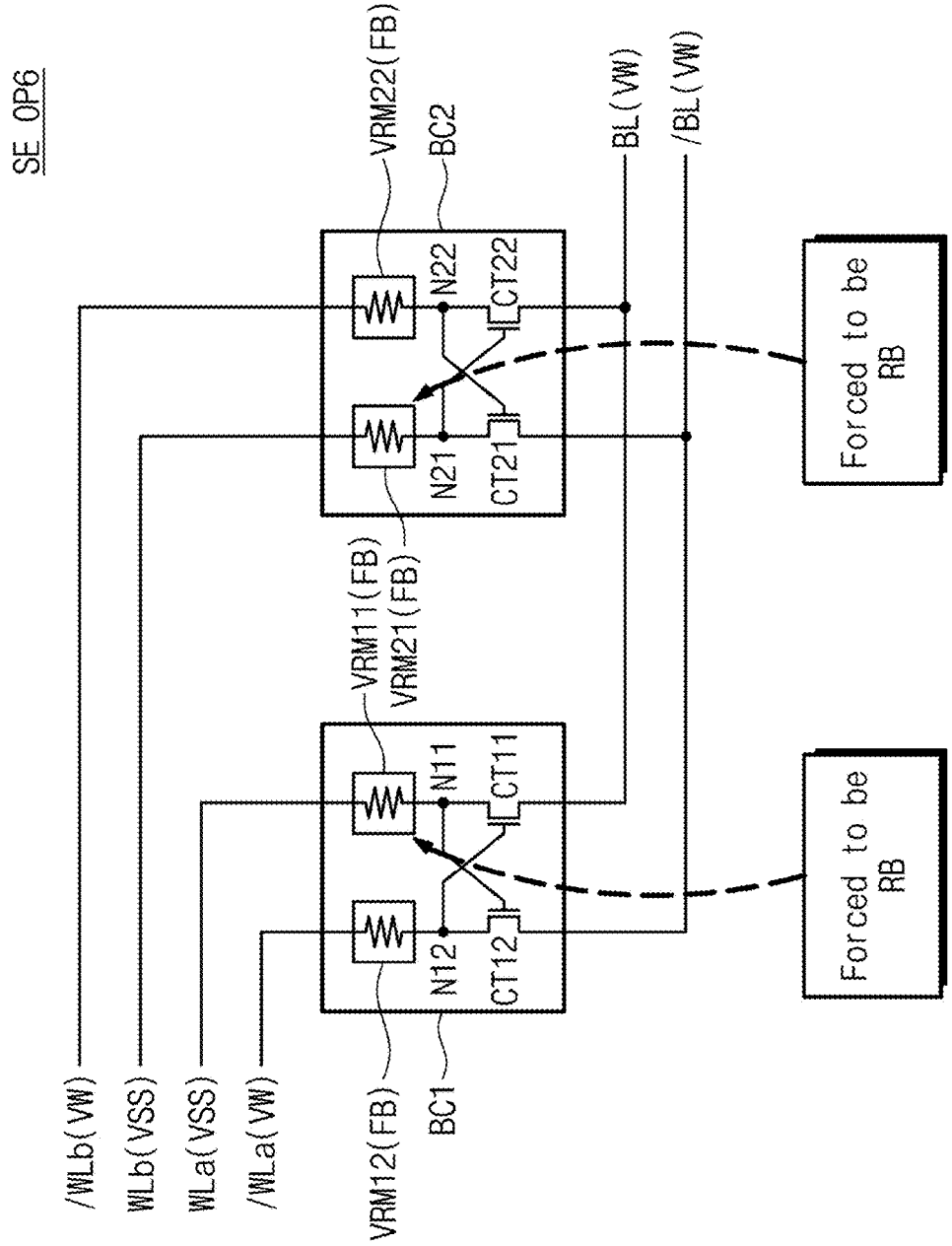

FIGS. 10 and 11 illustrate first examples SE_OP5 and SE_OP6 of an operation of updating and/or simultaneously updating resistance states of two variable resistance memory cells at the synapse element SE. Referring to FIGS. 1 and 10, the variable resistance memory cells VRM11 and VRM21 of the synapse element SE may have resistance states (e.g., high-resistance states, low-resistance states, etc.) according to a forward bias FB, and the variable resistance memory cells VRM12 and VRM22 of the synapse element SE may have resistance states (e.g., low-resistance states, high-resistance states, etc.) according to a reverse bias RB.

To update resistance states, the write voltage VW is applied to the wordlines WLa and WLb and inverted wordlines /WLa and /WLb, and the ground voltage VSS is applied to the bitline BL and the inverted bitline /BL. In this case, all the calculation transistors CT11, CT21, CT12, and CT22 of the synapse element SE are turned on, but is not limited thereto. Accordingly, the variable resistance memory cells VRM11, VRM21, VRM12, and VRM22 of the synapse element SE are forward biased.

Because the variable resistance memory cells VRM11 and VRM21 already have a resistance state according to the forward bias FB, the variable resistance memory cells VRM11 and VRM21 may have no influence of the bias of FIG. 10. Resistance states of the variable resistance memory cells VRM12 and VRM22 may change from a resistance state of the reverse bias RB to a resistance state of the forward bias FB.

Referring to FIGS. 1 and 11, the ground voltage VSS is applied to the wordlines WLa and WLb, and the write voltage VW is applied to the inverted wordlines /WLa and /WLb. In this case, all the calculation transistors CT11 and CT21 of the synapse element SE are turned on. When the write voltage VW is applied to the bitline BL, the variable resistance memory cells VRM11 and VRM21 are reverse biased (RB). Accordingly, resistance states of the variable resistance memory cells VRM11 and VRM21 may change from a resistance state of the forward bias FB to a resistance state of the reverse bias RB.

When the write voltage VW is applied to the bitline BL, the calculation transistors CT12 and CT22 of the synapse element SE may also be turned on. When the write voltage VW is applied to the inverted bitline /BL, the variable resistance memory cells VRM12 and VRM22 are impaired and/or prevented from being biased.

Figure 12:
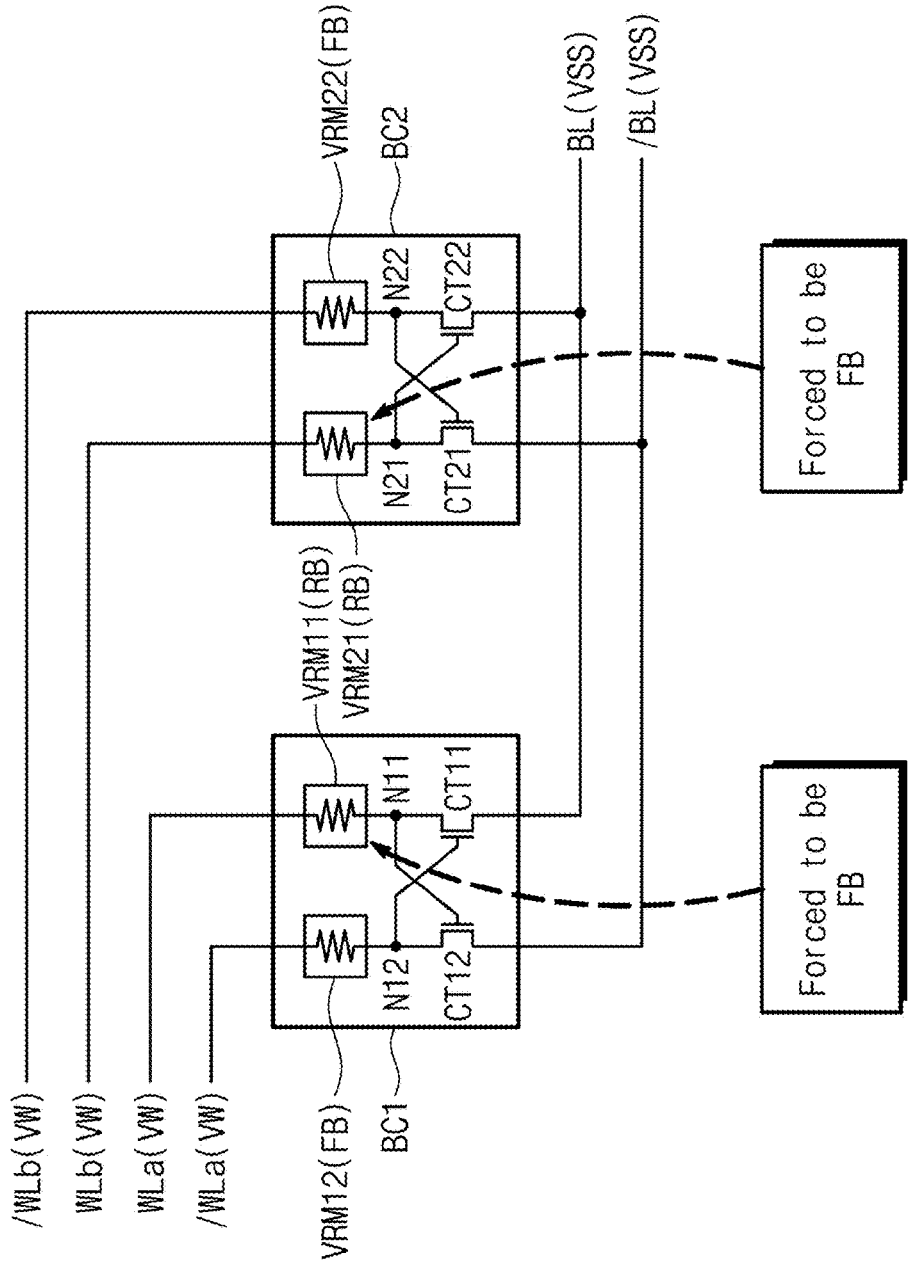
FIGS. 12 and 13 illustrate second examples of an operation of simultaneously updating resistance states of two variable resistance memory cells at a synapse element according to some example embodiment.
Figure 13:
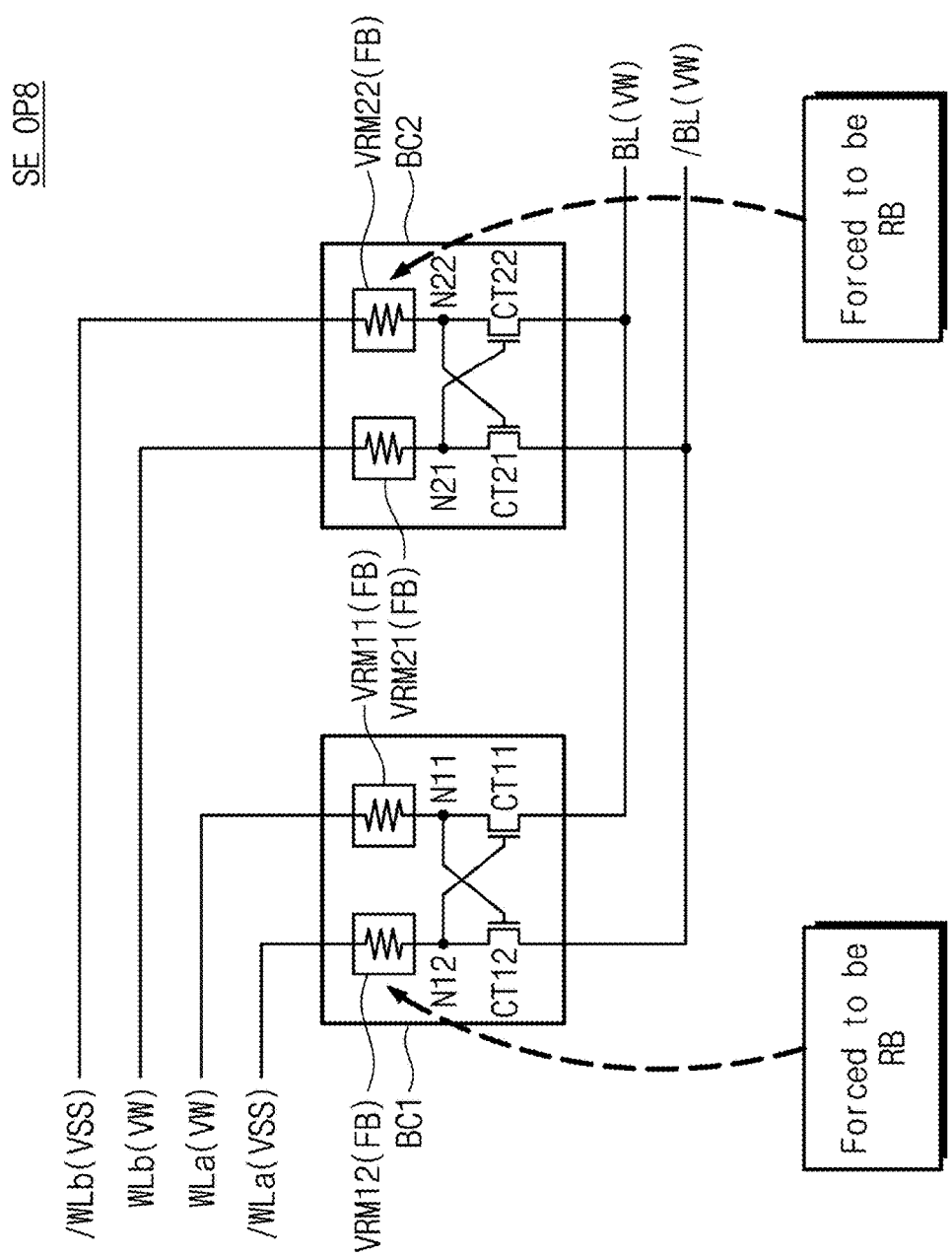

FIGS. 12 and 13 illustrate second examples SE_OP7 and SE_OP8 of an operation of updating and/or simultaneously updating resistance states of two variable resistance memory cells at the synapse element SE. Referring to FIGS. 1 and 12, in an environment following FIGS. 10 and 11, the variable resistance memory cells VRM11 and VRM21 may have resistance states according to the reverse bias RB, and the variable resistance memory cells VRM12 and VRM22 may have resistance states according to the forward bias FB.

To update resistance states, the write voltage VW is applied to the wordlines WLa and WLb and inverted wordlines /WLa and /WLb, and the ground voltage VSS is applied to the bitline BL and the inverted bitline /BL. In this case, all the calculation transistors CT11, CT21, CT12, and CT22 of the synapse element SE are turned on. Accordingly, the variable resistance memory cells VRM11, VRM21, VRM12, and VRM22 of the synapse element SE are forward biased.

Because the variable resistance memory cells VRM12 and VRM22 already have a resistance state according to the forward bias FB, the variable resistance memory cells VRM11 and VRM21 may have no influence of the bias of FIG. 12. Resistance states of the variable resistance memory cells VRM11 and VRM21 may change from a resistance state of the reverse bias RB to a resistance state of the forward bias FB.

Referring to FIGS. 1 and 13, the write voltage VW is applied to the wordlines WLa and WLb, and the ground voltage VSS is applied to the inverted wordlines /WLa and /WLb. In this case, all the calculation transistors CT12 and CT22 of the synapse element SE are turned on. When the write voltage VW is applied to the inverted bitline /BL, the variable resistance memory cells VRM12 and VRM22 are reverse biased (RB). Accordingly, resistance states of the variable resistance memory cells VRM12 and VRM22 may be forced and updated from a resistance state of the forward bias FB to a resistance state of the reverse bias RB.

When the write voltage VW is applied to the inverted bitline /BL, the calculation transistors CT11 and CT21 of the synapse element SE may also be turned on. When the write voltage VW is applied to the bitline BL, the variable resistance memory cells VRM11 and VRM21 are impaired and/or prevented from being biased.

As described with reference to FIGS. 10 to 13, the neuromorphic processor 100 may update all variable memory cells of each synapse element SE to resistance states according to the forward bias FB; afterwards, the neuromorphic processor 100 may update a weight (and/or synapse value) of the synapse element SE by updating desired and/or necessary variable resistance memory cells to resistance states according to the reverse bias RB.

Figure 14:
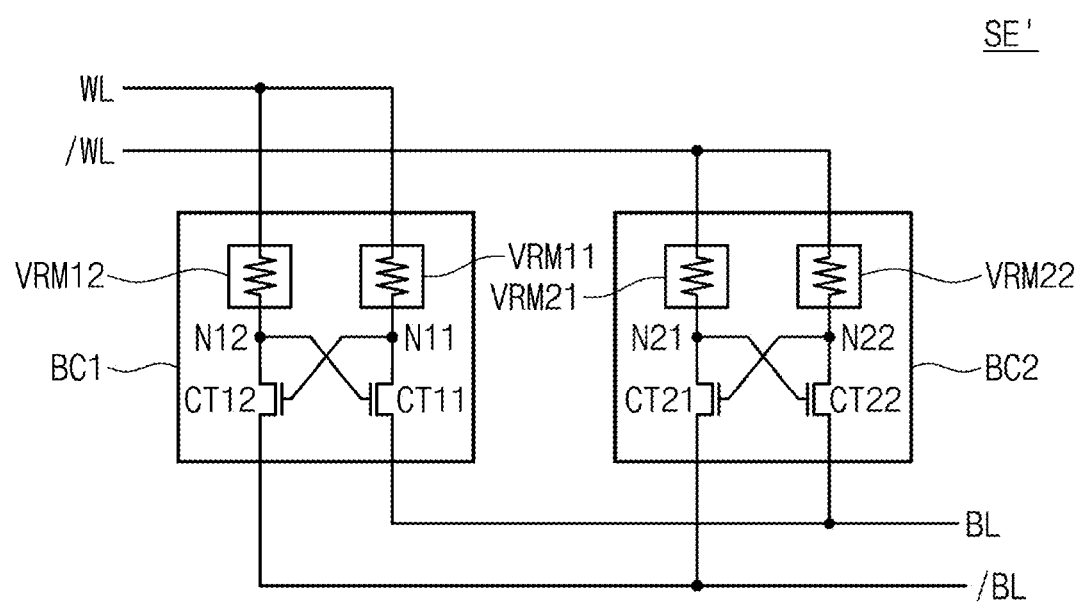
FIG. 14 illustrates an example in which a synapse element is connected with one wordline and one inverted wordline according to at least one example embodiment.

FIG. 14 illustrates an example in which the synapse element SE is connected with one wordline WL and one inverted wordline /WL according to at least one example embodiment. Referring to FIG. 14, the variable resistance memory cells VRM11 and VRM12 of the first bit cell BC1 of a synapse element SE' are connected in common with a wordline WL. The variable resistance memory cells VRM21 and VRM22 of the second bit cell BC2 of the synapse element SE' are connected in common with an inverted wordline /WL.

As described with reference to FIG. 6, in neural network calculation, the same voltage is applied to the first bit cell BC1 through the wordlines WLa and /WLa, and the same voltage is applied to the second bit cell BC2 through the wordlines WLb and /WLb. Accordingly, as illustrated in FIG. 14, even though one wordline is connected with one bit cell, the neural network calculation illustrated in FIG. 6 may be smoothly, quickly, and/or efficiently performed.

As illustrated in FIG. 9, when variable resistance memory cells are forward biased, the same voltage is applied to the wordlines WLa and WLb and the inverted wordlines /WLa and /WLb. Accordingly, as illustrated in FIG. 14, even though one wordline is connected with one bit cell, to apply the forward bias illustrated in FIG. 9 may be smoothly, quickly, and/or efficiently performed.

A variable resistance memory cell such as a phase change memory cell does not require directivity, such as a forward bias and a reverse bias, to update a resistance state. A resistance state of a phase change memory cell is updated during a time when a current flows, a temperature generated by a current amount, and/or a duration of the temperature, etc.

Accordingly, in the case where the variable resistance memory cells VRM11, VRM21, VRM12, and VRM22 of the synapse element SE' are implemented with memory cells, which do not require the directivity, such as phase change memory cells, the implementation that one wordline is connected with one bit cell is possible. Accordingly, it is possible to further simplify a configuration of the synapse element array 110 and the wordline bias circuitry 120 of the neuromorphic processor 100 of FIG. 7.

The variable resistance memory cells VRM11, VRM21, VRM12, and VRM22 are not limited to phase change memory cells. The variable resistance memory cells VRM11, VRM21, VRM12, and VRM22 may include all kinds, types, and/or configurations of variable resistance memory cells capable of switching between at least a low-resistance state and a high-resistance state through a unidirectional bias.

In the above example embodiments, components according to the inventive concepts are described by using the terms "first", "second", "third", and the like. However, the terms "first", "second", "third", and the like may be used to distinguish components from each other and do not limit the inventive concepts. For example, the terms "first", "second", "third", and the like do not involve an order or a numerical meaning of any form.

In the above example embodiments, one or more of the components may be implemented with various hardware devices, such as an integrated circuit, an application specific IC (ASIC), a field programmable gate array (FPGA), and a complex programmable logic device (CPLD), firmware driven in hardware devices, and/or a combination of a hardware device and software. Also, the blocks may include circuits implemented with semiconductor elements in an integrated circuit or circuits enrolled as intellectual property (IP).

According to according to at least one example embodiment of the inventive concepts, a synapse element and a neuromorphic processor are driven only by using one power supply voltage and one ground voltage. Accordingly, a neuromorphic processor decreasing and/or suppressing excessive power consumption is provided. Also, according to at least one example embodiment of the inventive concepts, a dynamic range of an output of the synapse element and the neuromorphic processor are extended to negative voltages as well as positive voltages. Accordingly, the synapse element and the neuromorphic processor in which a dynamic range of an output is extended to include negative values as well as positive values are provided.

While various example embodiments of the inventive concepts have been described with reference to example embodiments thereof, it will be apparent to those of ordinary skill in the art that various changes and modifications may be made thereto without departing from the spirit and scope of the example embodiments of the inventive concepts as set forth in the following claims.

What is claimed is:

1. A neuromorphic processor comprising at least a first synapse element, wherein
the first synapse element includes a first bit cell and a second bit cell,
the first bit cell is connected to a first bitline, a first inverted bitline, a first wordline, and a first inverted wordline, the first bit cell including a first transistor connected to the first bitline and a second transistor connected to the first inverted bitline and separate from the first transistor,
the second bit cell connected to the first bitline, the first inverted bitline, a second wordline, and a second inverted wordline, the second bit cell including a third transistor connected to the first bitline and a fourth transistor connected to the first inverted bitline and separate from the third transistor, and
the first synapse element is configured to,
receive a first input through the first wordline, the first inverted wordline, the second wordline, and the second inverted wordline,
store a first synapse value in the first bit cell and the second bit cell,
perform a calculation operation using the first input and the first synapse value, and
output a result of the calculation through the first bitline and the first inverted bitline.

2. The neuromorphic processor of claim 1, wherein the first bit cell further includes,
a first variable resistance memory element connected in series with the first transistor between the first wordline and the first bitline, and
a second variable resistance memory element connected in series with the second transistor between the first inverted wordline and the first inverted bitline;
a gate of the first transistor is connected between the second variable resistance memory element and the second transistor; and
a gate of the second transistor is connected between the first variable resistance memory element and the first transistor.

3. The neuromorphic processor of claim 2, wherein the second bit cell includes,
a third variable resistance memory element connected in series with a third transistor between the second wordline and the first bitline, and
a fourth variable resistance memory element connected in series with a fourth transistor between the second inverted wordline and the first bitline;
a gate of the third transistor is connected between the fourth variable resistance memory element and the fourth transistor; and
a gate of the fourth transistor is connected between the third variable resistance memory element and the third transistor.

4. The neuromorphic processor of claim 3, wherein, based on the first synapse value,
the first variable resistance memory element and the third variable resistance memory element have one of a high-resistance state or a low-resistance state in common; and
the second variable resistance memory element and the fourth variable resistance memory element have the other of the high-resistance state or the low-resistance state in common.

5. The neuromorphic processor of claim 3, wherein at least one of the first to fourth variable resistance memory elements includes at least one of a magnetic memory element, a resistance memory element, a phase change memory element, or a ferroelectric memory element.

6. The neuromorphic processor of claim 3, wherein, the calculating includes, based on the first input,
the first wordline and the first inverted wordline have one of a power supply voltage or a ground voltage in common; and
the second wordline and the second inverted wordline have the other of the power supply voltage or the ground voltage in common.

7. The neuromorphic processor of claim 3, wherein the first synapse element is further configured to:
store the first synapse value in the first to fourth variable resistance memory elements during a write operation, each of the first to fourth variable resistance memory elements being changed to a high-resistance state or a low-resistance state independent of the other variable resistance memory elements, based on a voltage of the corresponding wordline and a voltage of the corresponding bitline.

8. The neuromorphic processor of claim 3, wherein the first synapse element is further configured to:
store the first synapse value in the first to fourth variable resistance memory elements during a write operation, the storing including
the first to fourth variable resistance memory elements being simultaneously changed to one of a high-resistance state or a low-resistance state, and
one of a first pair of the first and third variable resistance memory elements and a second pair of the second and fourth variable resistance memory elements being changed to the other of the high-resistance state or the low-resistance state.

9. The neuromorphic processor of claim 1, further comprising:
a second synapse element connected to the first bitline, the first inverted bitline, a third wordline, a third inverted wordline, a fourth wordline, and a fourth inverted wordline; and
the second synapse element is configured to,
store a second synapse value,
receive a second input being through the third wordline, the third inverted wordline, the fourth wordline, and the fourth inverted wordline,
perform a second calculation using the second input and the second synapse value, and
output a result of the second calculation through the first bitline and the first inverted bitline.

10. The neuromorphic processor of claim 9, wherein
the first input and the second input are simultaneously provided; and
the calculation result of the first synapse element and the calculation result of the second synapse element are simultaneously provided to the first bitline and the first inverted bitline.

11. The neuromorphic processor of claim 9, further comprising:
a sense amplifier configured to,
sense the amounts of current flowing through the first bitline and the first inverted bitline, and
output the sensed current amounts as an output voltage; and
an analog-to-digital converter configured to digitize the output voltage into a digital value.

12. The neuromorphic processor of claim 1, further comprising:
a second synapse element connected to a second bitline, a second inverted bitline, the first wordline, the first inverted wordline, the second wordline, and the second inverted wordline; and
the second synapse element is configured to,
store a second synapse value,
perform an exclusive negative OR (XNOR) operation on the first input and the second synapse value, and
output a result of the performed XNOR operation through the second bitline and the second inverted bitline.

13. The neuromorphic processor of claim 12, further comprising:
a decoder configured to,
decode a bitline address, and
output a selection signal depending on the decoded bitline address;

a multiplexer configured to select one of a first pair and a second pair in response to the selection signal, the first pair including the first bitline and the first inverted bitline, and the second pair including the second bitline and the second inverted bitline;
a sense amplifier configured to sense a current amount of the selected pair, and output the sensed current amount as an output voltage; and
an analog-to-digital converter configured to digitize the output voltage into a digital value.

14. A neuromorphic processor comprising:
a plurality of synapse elements each connected to a plurality of wordlines, a plurality of inverted wordlines, a plurality of bitlines, and a plurality of inverted bitlines, wherein
each of the plurality of synapse elements includes,
a first bit cell connected to one bit line of the plurality of bitlines, one inverted bitline of the plurality of inverted bitlines, and one wordline of the plurality of wordlines, the first bit cell including a first transistor connected to the one bitline and a second transistor connected to the one inverted bitline and separate from the first transistor, and
a second bit cell connected to the one bitline, the one inverted bitline, and one inverted wordline corresponding to the one wordline of the plurality of wordlines, the second bit cell including a third transistor connected to the one bitline and a fourth transistor connected to the one inverted bitline and separate from the third transistor, and
each of the plurality of synapse elements are configured to,
store a synapse value in the first bit cell and the second bit cell,
receive an input through the one wordline and the one inverted wordline,
perform a calculation operation based on the input and the synapse value, and
output a result of the calculation operation through the one bitline and the one inverted bitline.

15. The neuromorphic processor of claim 14, wherein
each of the first bit cell of the plurality of synapse elements further includes,
a first variable resistance memory element connected in series with the first transistor between the one wordline and the one bitline,
a second variable resistance memory element connected in series with the second transistor connected in series between the one wordline and the one inverted bitline,
a gate of the first transistor is connected between the second variable resistance memory element and the second transistor, and
a gate of the second transistor is connected between the first variable resistance memory element and the first transistor; and
each of the second bit cell of the plurality of synapse elements further includes,
a third variable resistance memory element connected in series with the third transistor between the one inverted wordline and the one inverted bitline, and
a fourth variable resistance memory element connected in series with the fourth transistor between the one inverted wordline and the one bitline,
a gate of the third transistor is connected between the fourth variable resistance memory element and the fourth transistor, and a gate of the fourth transistor is connected between the third variable resistance memory element and the third transistor.

16. The neuromorphic processor of claim 15, wherein at least one of the first to fourth variable resistance memory elements includes a phase change memory element.

17. The neuromorphic processor of claim 15, wherein each of the plurality of synapse elements are configured to:
perform a write operation on the first variable resistance memory element, the write operation including,
applying a write voltage to the one wordline,
applying a ground voltage to the one bitline, and
applying the write voltage to the one inverted bitline.

18. The neuromorphic processor of claim 14, further comprising processing circuitry configured to,
provide inputs to the plurality of wordlines and the plurality of inverted wordlines during the calculation operation;
detect an amount of current of a bitline selected from the plurality of bitlines, and an amount of current of an inverted bitline selected from the plurality of inverted bitlines during the calculation operation; and
store the detected amounts of current in memory, and
select another bitline of the plurality of bitlines, and another inverted bitline of the plurality of inverted bitlines based on the stored detected amounts of current.

19. A synapse element comprising:
a first variable resistance memory element connected in series with a first transistor between a first input node and a first output node;
a second variable resistance memory element connected in series with a second transistor between a second input node and a second output node;
a third variable resistance memory element connected in series with a third transistor between a third input node and the second output node; and
a fourth variable resistance memory element connected in series with a fourth transistor between a fourth input node and the first output node, wherein
a gate of the first transistor is connected between the second variable resistance memory element and the second transistor,
a gate of the second transistor is connected between the first variable resistance memory element and the first transistor,
a gate of the third transistor is connected between the fourth variable resistance memory element and the fourth transistor, and
a gate of the fourth transistor is connected between the third variable resistance memory element and the third transistor,
wherein the first transistor, the second transistor, the third transistor and the fourth transistor are separate from each other.

20. The synapse element of claim 19, wherein
the first input node and the second input node are connected; and
the third input node and the fourth input node are connected.

* * * * *